United States Patent

Ohmori

[11] Patent Number: 5,991,106
[45] Date of Patent: Nov. 23, 1999

[54] AGC CIRCUIT OF DISK STORAGE APPARATUS

[75] Inventor: Hideki Ohmori, Kawasaki, Japan

[73] Assignee: Fujitsu Limited, Kawasaki, Japan

[21] Appl. No.: 08/822,062

[22] Filed: Mar. 24, 1997

[30] Foreign Application Priority Data

Jul. 22, 1996 [JP] Japan ................................. 8-192065

[51] Int. Cl.$^6$ ...................................................... G11B 5/09
[52] U.S. Cl. ................................. 360/46; 360/67; 360/48
[58] Field of Search .............................. 360/67, 46, 48, 360/8, 65, 32; 330/254, 278

[56] References Cited

U.S. PATENT DOCUMENTS

| 5,438,460 | 8/1995 | Coker et al. . |
| 5,463,603 | 10/1995 | Petersen ................................ 360/61 X |
| 5,574,709 | 11/1996 | Takeda .................................. 360/46 X |
| 5,684,651 | 11/1997 | Yaegashi et al. ....................... 360/46 X |

FOREIGN PATENT DOCUMENTS 6111478  4/1994  Japan .

*Primary Examiner*—Alan Faber
*Attorney, Agent, or Firm*—Greer, Burns & Crain

[57] ABSTRACT

An AGC circuit is used for read channels of a disk storage apparatus, by controlling a level of a reading output of a head to be kept constant. This AGC circuit has a gain control amplifier and a feedback circuit for digitally feeding back an output thereof. A maximum current value of a current type D/A converter is varied for every zone in zone bit recording. A gain adjusting time of the AGC circuit can be therefore minimized in each zone. A GAP length in the respective zones can be thereby reduced, and a storage capacity is increased. A maximum current value of the current type D/A converter is varied in a read/write area and a data surface servo area on a disk storage medium. It is therefore feasible to minimize the gain adjusting time of the AGC circuit in each of the servo area and the read/write area. The current type D/A converter is set so that a plus-side maximum current value is different from a minus-side maximum current value. The operation is therefore speeded up when increasing a gain, and the gain adjusting time of the AGC circuit can be minimized.

15 Claims, 27 Drawing Sheets

| ZONE | SET VALUE |
|------|-----------|
| 1~3  | 001       |
| 4~6  | 010       |
| 7~9  | 011       |
| 10, 11 | 100     |

FIG. 6

| ZONE | TRANSFER RATE | IDAC SET REGISTER | IDAC MAXIMUM CURRENT |
|---|---|---|---|
| 1 TO 3 | 10.0 TO 11.3 MB/s | 001 | ± 9μA |
| 4 TO 6 | . . . | 010 | ±11μA |
| 7 TO 9 | . | 011 | ±13μA |
| 10, 11 | 17.4, 17.5 MB/s | 100 | ±15μA |
| SERVO | CORRESPONDING TO TRANSFER 11.1 MB/s | 000 | ±10μA |

FIG. 7

| 3-bit INPUT | 5-bit OUTPUT | REFERENCE CURRENT SOURCE | IDAC OUTPUT RANGE |
|---|---|---|---|
| 000 | 00001 | 10μA | ±10μA |
| 001 | 00010 | 9μA | ±9μA |
| 010 | 00100 | 11μA | ±11μA |
| 011 | 01000 | 13μA | ±13μA |
| 100 | 10000 | 15μA | ±15μA |

FIG. 9

| ZONE | TRANSFER RATE | IDAC SET REGISTER | IDAC MAXIMUM CURRENT |
|---|---|---|---|
| 1 TO 3 | 10.0 TO 11.3 MB/s | 001 | +9,-17 μA |
| 4 TO 6 | . . . | 010 | . . . |
| 7 TO 9 | | 011 | |
| 10, 11 | 17.4, 17.5 MB/s | 100 | +15,-28 μA |
| SERVO | (CORRESPONDING TO TRANSFER 11.1 MB/s) | 000 | +10,-19 μA |

FIG. 15

AGC CIRCUIT OF DISK STORAGE APPARATUS

BACKGROUND OF THE INVENTION

1. Field of the Invention

The present invention relates generally to an AGC circuit used for a read channel in a disk storage apparatus and, more particularly, to an AGC circuit of a disk storage apparatus for controlling a level of a reading signal of a head to be kept constant.

2. Description of the Related Art

A magnetic disk apparatus is a storage apparatus for writing and reading the data to and from a magnetic disk by a magnetic head. This magnetic disk apparatus has a read channel for reading the data written to the magnetic disk. An AGC (Automatic Gain Control) circuit is provided for the purpose of uniformizing amplitudes of the data read out in the read channels.

That is, the surface of a storage medium appears to be seemingly flat. An actual signal, however, fluctuates in terms of output due to a minute medium defects and medium unevenness. Therefore, in the AGC circuit, after controlling the readout signal with a constant amplitude, signal processing for demodulation is executed.

On the other hand, the AGC circuit used in the read channel of a partial response system has a feedback loop with the digital data. Employed in this feedback loop are a current type digital-to-analog converter for converting a digital error signal into an analog control quantity, and a loop filter. This current type digital-to-analog converter is requested to set an analog control quantity so that an AGC adjustment area on the magnetic disk is minimized.

FIG. 23 is a diagram showing a construction of the prior art. FIG. 24 is an explanatory diagram showing the prior art.

FIG. 23 illustrates a digital AGC circuit used in the read channel of the partial response system. An analog signal read by a magnetic head (unillustrated) from a magnetic disk (unillustrated), is inputted to a gain control amplifier 90. The gain control amplifier (GCA) 90 amplifies an input signal with a gain corresponding to a control voltage.

An output of this gain control amplifier 90 is inputted to an analog filter 91. The analog filter 91 is a PR-4 (Partial Response class 4) filter. An output of the analog filter 91 is inputted to an A/D (analog-to-digital) converter 92. The A/D converter 92 converts the output of the analog filter 91 into a digital value by sampling it in accordance with a VFO clock defined as a clock of a voltage control oscillator. This digital value is an output of the digital AGC circuit.

The thus converted digital value is inputted to a gain correction circuit 93. The gain correction circuit 93 calculates an error between a target amplitude value and the thus inputted digital value. This error signal is inputted to a current type D/A (digital-to-analog) converter 94. The current type D/A converter 94 converts the digital error signal into an analog current quantity. This analog current is inputted to a loop filter 95 consisting of a condenser. The loop filter 95 converts the analog current into a control voltage. Then, the loop filter 95 supplies a gain control amplifier 90 with this control voltage.

An operation of the AGC circuit having the above-mentioned digital feedback will be explained referring to FIG. 24. As shown in FIG. 24, the error signal is updated at an interval of a sampling period of the A/D converter 92, and hence an error current is also updated at the interval of the sampling period of the A/D converter 92.

The condenser of the loop filter 95 is charged with the error current, thereby generating the control voltage. The AGC control voltage is therefore also updated at the interval of the sampling period of the A/D converter 92.

Herein, the control voltage $V_n$ of present sample time is expressed by the following formula:

$$V_n = (T/C) \times V_n + V_{n-1}$$

where T is the sampling period of the A/D converter 92, C is the constant of the condenser of the loop filter 95, Vn is the current value of the error quantity, and $V_{n-1}$ is the control voltage one sample before.

FIG. 25 is an explanatory diagram showing a track format in the prior art.

The track format on the magnetic disk medium has, as illustrated in FIG. 25, a servo area and a read/write area. A "GAP" is provided in front of the data area in the read/write area. Data of a single period is written to the GAP. AGC control operates when in a GAP reading process. Then, it is required that an AGC gain be adjusted to an optimum value before reading the data from the data area. The AGC gain is adjusted in this GAP area. With this adjustment, a clock (VFC) clock) of a voltage frequency oscillator is synchronized, thus adjusting a phase of a read clock.

Accordingly, the GAP length is set corresponding to a time length for which the AGC gain can be adjusted. As this GAP length becomes smaller, a wider data area can be provided, resulting in an increase in storage capacity.

According to the prior art, the maximum current value of the above-described current type D/A converter 94 and the constant of the condenser of the loop filter 95, are set to minimize the GAP length.

For example, if the GAP length required for optimally adjusting the gain when a variation quantity of the control voltage at the interval of the period T is small, the maximum current value of the current type D/A converter 94 is increased, or alternatively the constant of the condenser is decreased. Reversely if an overshoot occurs when the variation quantity of the control voltage at the interval of the period T is large, the maximum current value of the current type D/A converter 94 is decreased, or alternatively the constant of the condenser is increased.

Further, as shown in FIG. 25, the data is written to the servo area when delivered from the factory. The servo area is distinguished from the read/write area by a servo gate signal *SVGT.

FIG. 26 is an explanatory diagram of a zone bit record, for explaining the problems inherent in the prior art. FIG. 27 is an explanatory diagram of a conventional AGC operation, for explaining the problems peculiar to the prior art.

The following problems, however, arise in the prior art. First, as shown in FIG. 26, a zone bit recording method is known. According to this zone bit recording method, the magnetic disk is segmented into concentric zones. Then, a transfer rate (a write frequency) is set higher as the zone is disposed more outward. With this arrangement, bit densities are equalized in the respective zones. Consequently, a recording density is enhanced.

When the prior art AGC gain adjusting method is applied to this zone bit recording method, the following problems might arise. According to the zone bit recording method, the period T differs depending on the respective zones. Accordingly, when the period T is decreased, the time for charging the condenser with the current is reduced. The variation quantity of the control voltage at the interval of the period T is thereby decreased. Reversely when the period T elongates, the time for charging the condenser with the current increases. This augments the variation quantity of the control voltage at the interval of the period T.

Consequently, one problem is that the GAP length can not be minimized in another zone even by adjusting the AGC maximum current value to minimize the GAP length in a certain zone. This leads to another problem, wherein a rise in storage efficiency by the zone bit recording method is hindered.

Second, in the zone bit recording method, the transfer rate in the servo area is fixed in each zone. This is because it is difficult to perform positioning at each zone boundary if the transfer rate in the servo area is changed in the respective zones.

Therefore, the transfer rate in the read/write area is different from that in the servo area according to the zone bit recording method. Namely, it follows that the period T differs. This reduces to such a problem that the time needed for optimally adjusting the AGC gain in the servo area is not minimized even when the AGC maximum current value is adjusted to minimize the GAP length in the read/write area as described above. Hence, there exists a problem of hindering the rise in the storage efficiency of the zone bit recording method.

Third, as shown in FIG. 27, let S2 be the signal having a target amplitude, and a 2-fold amplitude signal becomes S1, and a ½-fold amplitude signal is S3. For example, when switched over to a head having a 2-fold output level, and when changed from the target amplitude signal S2 to the signal S1, a difference from the target value is "16". While on the other hand, when switched over to a head having a one-half output Level, and when changed from the target amplitude signal S2 to the signal S3, the difference from the target value is "8".

Therefore, the difference is smaller when increasing the gain as in the case of becoming the signal S3 than when decreasing the gain as in the case of becoming the signal S1. Hence, the problem is that the operation becomes slower when increasing the gain than when decreasing the gain. This results in such a problem that the rise in the storage efficiency is hindered because of the longer time needed for optimally adjusting the AGC gain.

SUMMARY OF THE INVENTION

It is a primary object of the present invention to provide an AGC circuit of a disk storage apparatus, for increasing a storage capacity by reducing a GAP length.

It is another object of the present invention to provide an AGC circuit of a disk storage apparatus, for increasing the storage capacity by reducing a time required for optimally adjusting an AGC gain.

It is still another object of the present invention to provide an AGC circuit of a disk storage apparatus, for increasing the storage capacity by making a time fixed that is needed for adjusting the AGC gain in each zone with respect to a zone bit recording disk.

It is a further object of the present invention to provide an AGC circuit of a disk storage apparatus, for increasing the storage capacity by reducing the time needed for adjusting the AGC gain in each zone with respect to the zone bit recording disk.

It is a still further object of the present invention to provide an AGC circuit of a disk storage apparatus, for increasing the storage capacity by reducing the time for optimally adjusting the AGC gain with an increased operating speed when enhancing a gain.

According to one aspect of the present invention, a disk storage apparatus includes a disk storage medium with different transfer rates in respective zones formed in a circumferential direction, and a head for reading the data from this disk storage medium.

Provided is an AGC circuit for making constant a reading output level of this head. This AGC circuit comprises a gain control amplifier for amplifying the reading output with a gain corresponding to a control voltage, a filter for filtering a signal transmitted from the gain control amplifier, an analog-to-digital converter for performing an analog-to-digital conversion of the signal from the filter, an error calculator for calculating an error between a target amplitude value and a digital output value of the analog-to-digital converter, a current type digital-to-analog converter for generating an electric current having a magnitude corresponding to the error, a loop filter for converting the current into the control voltage, and a control circuit for changing a maximum current value of the current type digital-to-analog converter in accordance with the zone sought by the head.

According to another aspect of the present invention, the control circuit changes the maximum current value of the current type digital-to-analog converter in a read/write area and in a data surface servo area on the disk storage medium.

According to still another aspect of the present invention, the current type digital-to-analog converter is constructed so that the plus-side maximum current value is different from the minus-side maximum current value.

According to yet another aspect of the present invention, the error calculator includes a circuit for converting the digital signal indicating the error so that a plus-side bit weight of the digital signal indicating the error is different from a minus-side bit weight of the digital signal indicating the error.

According to the present invention, first, the maximum current value of the current type digital-to-analog converter is changed for every zone in a zone bit record. Therefore, it is possible to minimize a gain adjusting time of the AGC circuit in each zone even if a sampling period varies in each zone. A GAP length in respective zones can be thereby reduced, resulting in an increment in storage capacity.

Second, the maximum current value of the current type digital-to-analog converter is changed in the data surface servo area and in the read/write area on the disk storage medium in the zone bit record. Hence, it is feasible to minimize the gain adjusting time of the AGC circuit in each of the servo area and the read/write area even if the sampling period changes in each area. The GAP length in the read/write area can be thereby reduced, and further the GAP length in the servo area can be also reduced, resulting in the increment in the storage capacity.

Third, the current digital-to-analog converter is constructed so that the plus-side maximum current value is different from the minus-side maximum current value. Moreover, the error calculator has the circuit for converting the digital signal so that the bit weight of the digital signal indicating a plus-side error is different from a bit weight of the digital signal indicating a minus-side error.

Therefore, the operation is speeded up even when increasing the gain, and it is feasible to minimize the gain adjusting time of the AGC circuit. Hence, the GAP length in the read/write area can be reduced, whereby the storage capacity can be enlarged.

Other features and advantages of the present invention will become readily apparent from the following description taken in conjunction with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principle of the invention, in which:

FIG. 6 is a diagram showing a structure of a table in FIG. 2;

FIG. 7 is an explanatory diagram of the operation in the first embodiment of the present invention;

FIG. 9 is an explanatory chart of the operation in the construction shown in FIG. 8;

FIG. 15 is an explanatory diagram of the operation in a second embodiment of the present invention;

DETAILED DESCRIPTION OF THE PREFERRED EMBODIMENTS

Figure 1:
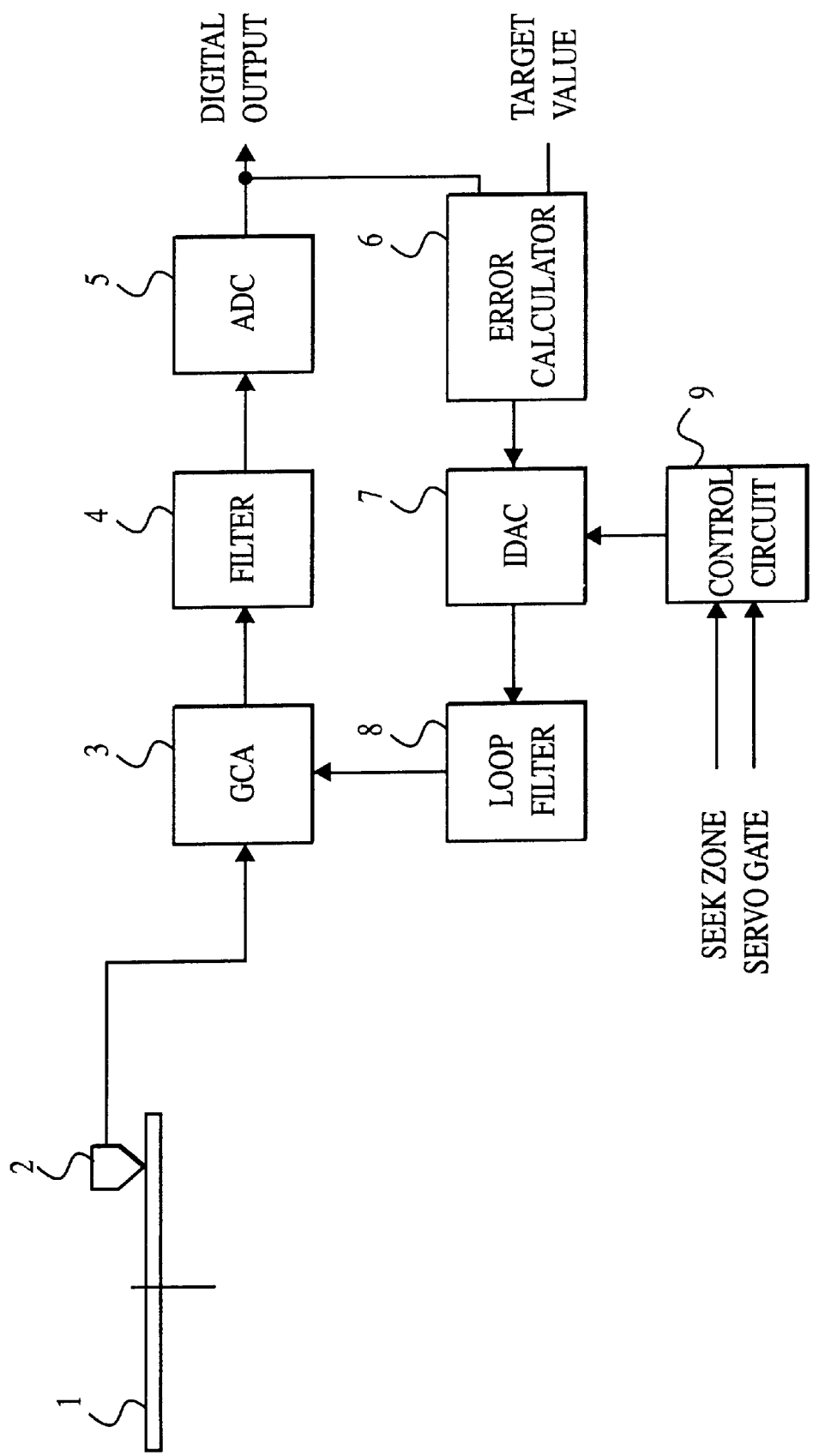
FIG. 1 is a diagram showing the principle of the present invention.

FIG. 1 is a view showing the principle of the present invention.

Figure 26:
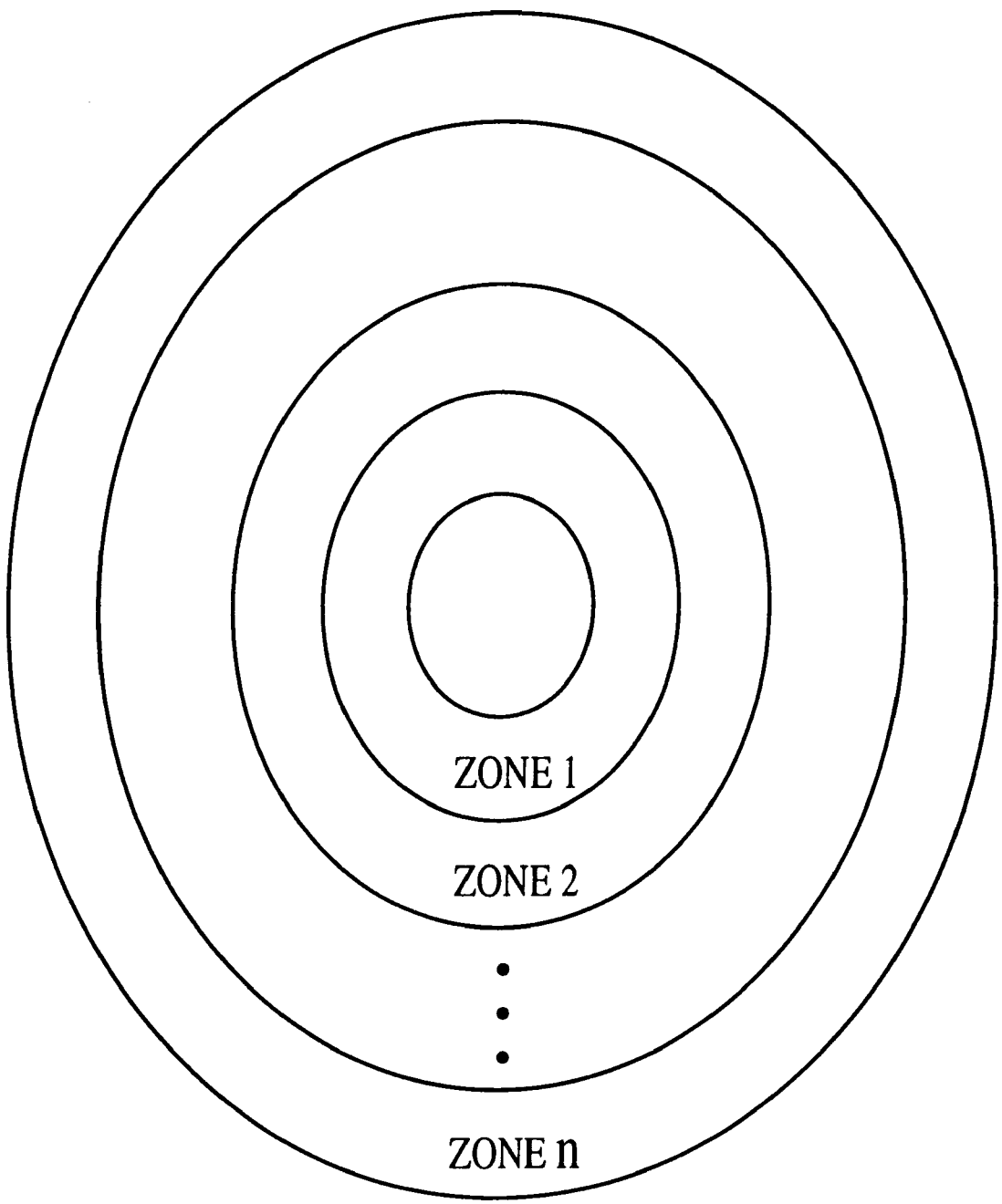
FIG. 26 is an explanatory diagram showing a zone bit record.

A disk storage apparatus includes, as illustrated in FIG. 26, a disk storage medium 1 having transfer rates different in respective zones provided in a circumferential direction, and a head 2 for reading data from this disk storage medium 1.

An AGC circuit makes constant a level of a reading output of this head 2. A gain control amplifier 3 amplifies the reading output with a gain corresponding to a control voltage. A filter 4 filters a signal coming from a gain control amplifier 3. An analog/digital converter 5 performs an analog-to-digital conversion of a signal coming from the filter 4. An error calculator 6 calculates an error between a target amplitude value and a digital output value of the analog-to-digital (A/D) converter 5. A current type digital-to-analog converter 7 generates an electric current with a magnitude corresponding to the error. A loop filter 8 converts the current into a control voltage. A control circuit 9 changes a maximum current value of the current type digital-to-analog(D/A) converter 7 in accordance with a zone sought by the head 2.

Further, this control circuit 9 changes the maximum current value of the current type D/A converter 7 in a data surface servo area and a read/write area on the disk storage medium 1.

Moreover, this current type D/A converter 7 is constructed so that a plus-side maximum current value is different from a minus-side maximum current value.

The error calculator 6 includes a circuit for converting the digital signal so that a plus-side bit weight of the digital signal indicating the error is different from a minus-side bit weight of the digital signal indicating the error.

Figure 2:
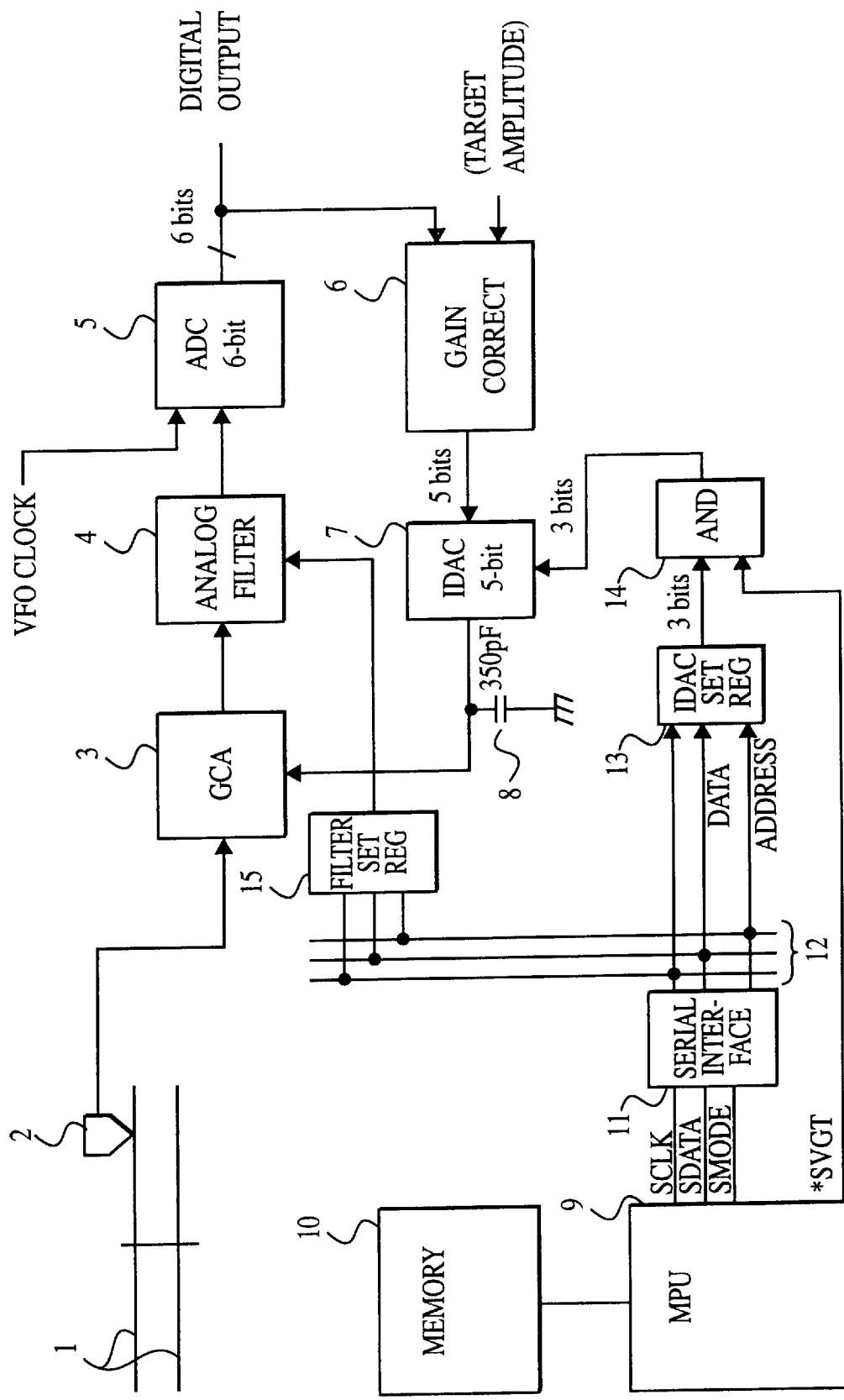
FIG. 2 is a diagram showing a construction in a first embodiment of the present invention.
Figure 3:
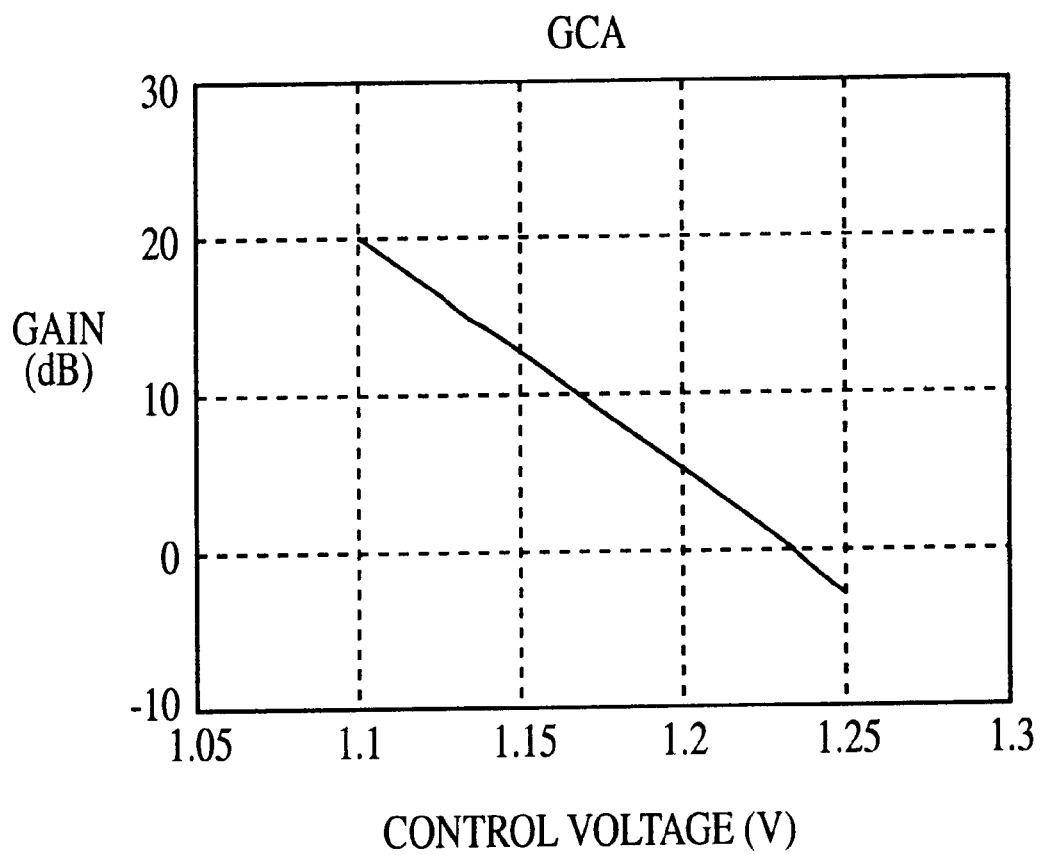
FIG. 3 is a characteristic diagram of a gain control amplifier shown in FIG. 2.
Figure 4:
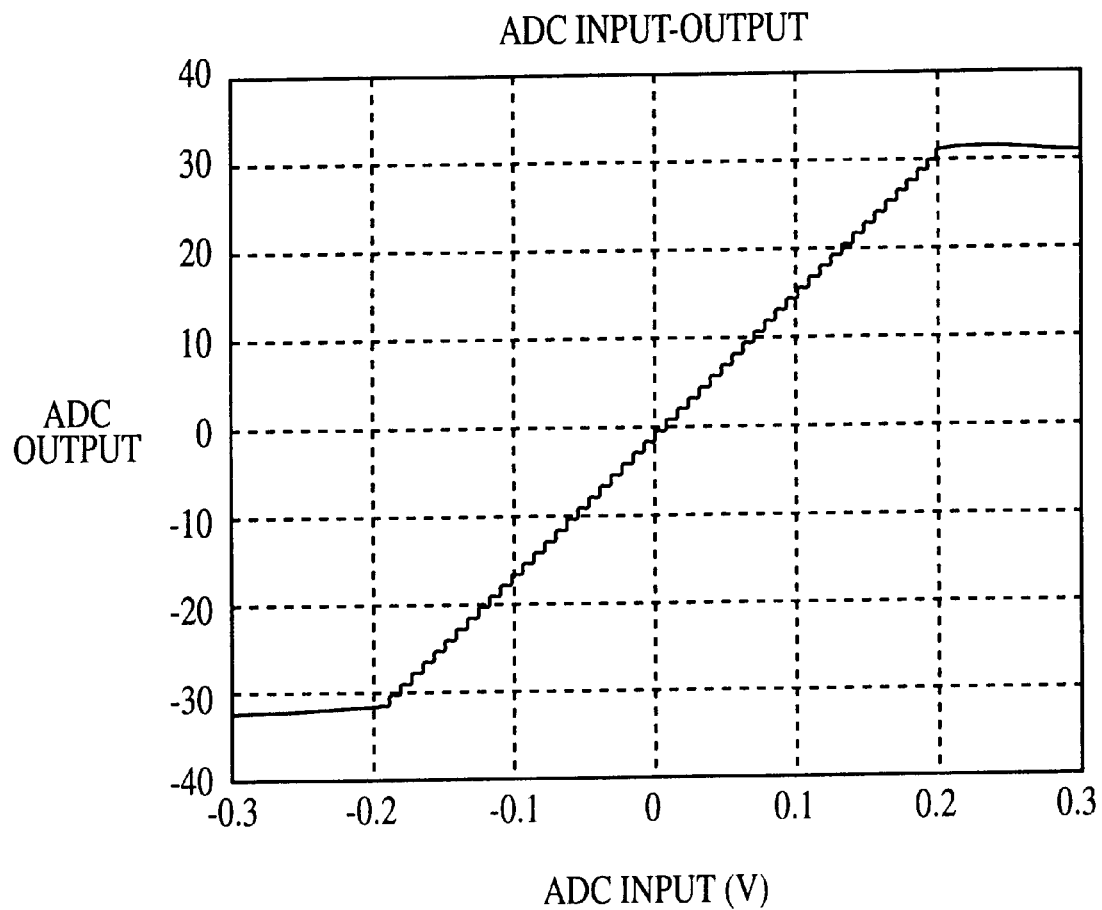
FIG. 4 is an input-output characteristic of an analog-to-digital converter shown in FIG. 2.
Figure 5:
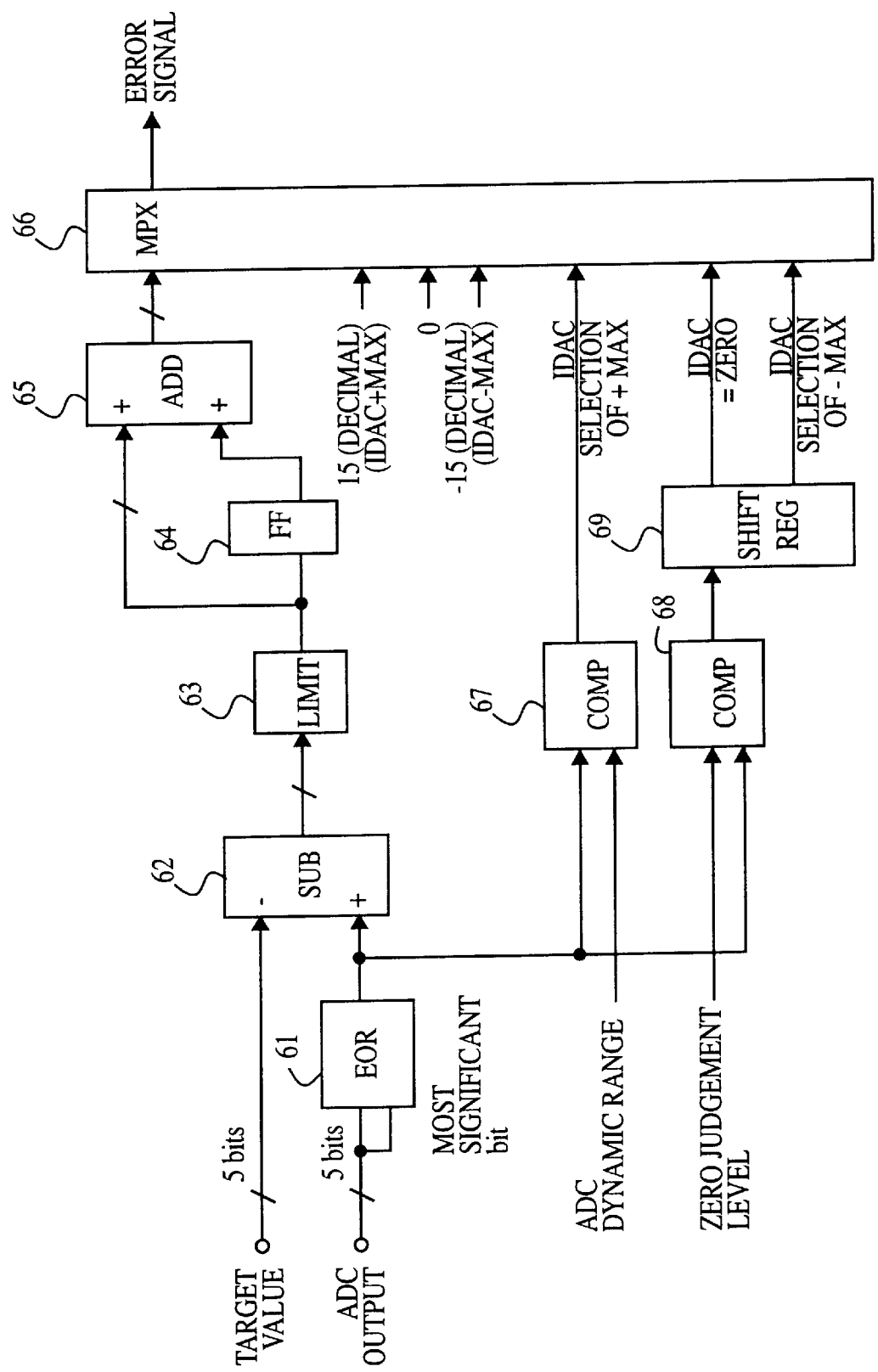
FIG. 5 is a diagram illustrating a construction of a gain correction circuit shown in FIG. 2.
Figure 6:
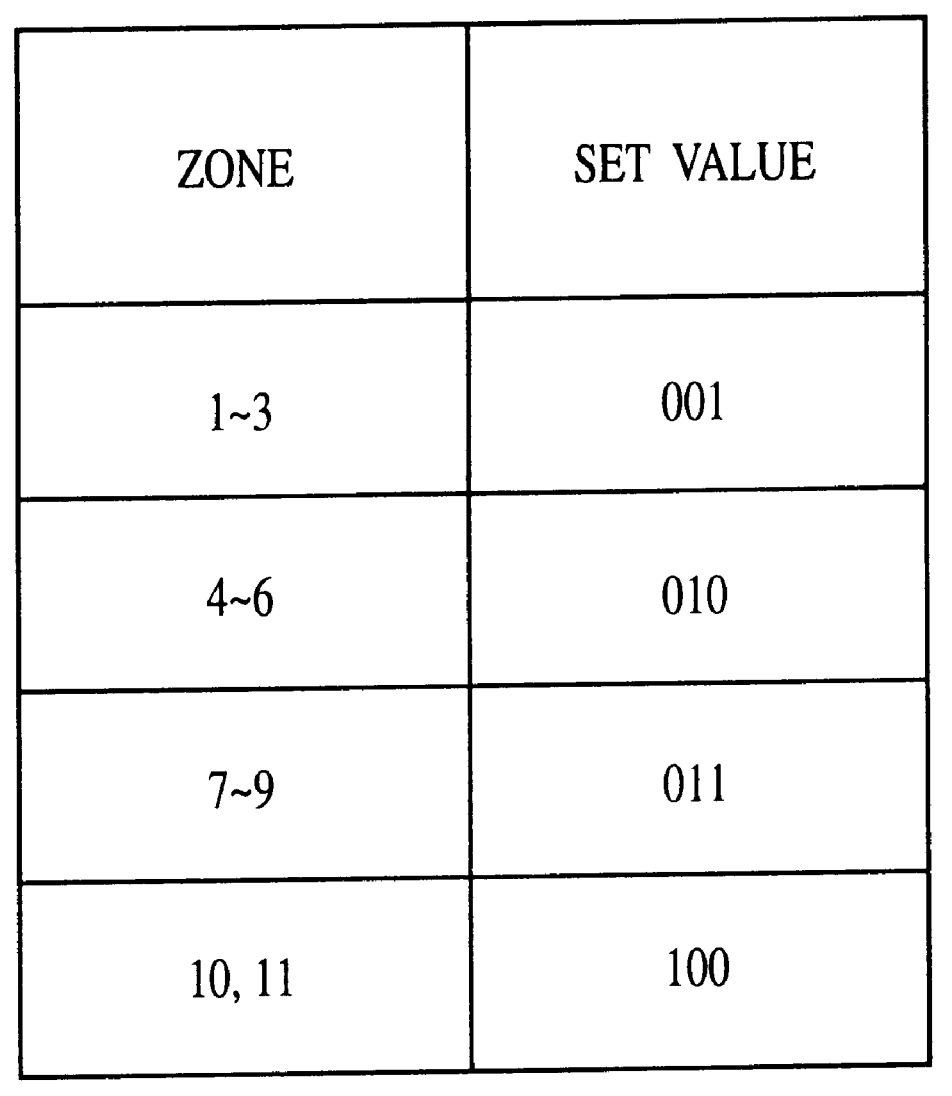

FIG. 2 is a diagram illustrating a construction in a first embodiment of the present invention. FIG. 3 is a characteristic diagram of the gain control amplifier shown in FIG. 2. FIG. 4 is a diagram showing an I/O (Input/Output) characteristic of the A/D converter shown in FIG. 2. FIG. 5 is a diagram showing a construction of a gain correction circuit shown in FIG. 2. FIG. 6 is a block diagram of a table shown in FIG. 2. FIG. 7 is a diagram showing an operation in FIG. 6.

Referring to FIG. 2, the same components as those shown in FIG. 1 are marked with the like numerals.

Zone bit recording is effected on the magnetic disk 1 as shown in FIG. 26. Then, as will be explained in FIG. 7, there are provided eleven zones "1"–"11". A transfer rate of the innermost peripheral zone "1" is on the order of 10.0 MB (Mega Byte)/s, while the transfer rate of the outermost peripheral zone "11" is 17.5 MB (Mega Byte)/s. A track format goes as explained in FIG. 25. The transfer rate of that servo area is common to every zone and is 11.1 MB (Mega Byte)/s.

The magnetic head 2 reads and writes the data from and to the magnetic disk 1. The analog signal read by the magnetic head 2 is inputted to the gain control amplifier (GCA) 3. The gain control amplifier 3 operates, as shown in FIG. 3, linearly in a range of a control voltage of 1.1 V through 1.25 V. Then, a gain operates in 20 dB through −3 dB.

An output of the gain control amplifier 3 is inputted to an analog filter 4. The analog filter 4 is a PR-4 (Partial Response class 4) filter. A filter setting register 15 is connected to this analog filter 4.

After receiving a seek command, a microprocessor 9 which will be mentioned later on sets a cut-off frequency and a boost quantity in this filter setting register 15 for every zone through a serial interface circuit 11 and a serial interface 12. The cut-off frequency and the boost quantity of the analog filter 4 thereby change for every zone.

An output of this analog filter 4 is inputted to the A/D converter 5. The A/D converter 5 converts an output of the analog filter 4 into a digital value by sampling in accordance with a VFO clock defined as a clock of a voltage control oscillator. This digital value is an output of the digital AGC circuit.

The output of the A/D converter 5 changes, as shown in FIG. 4, from "−32" to "+31" with respect to an input of ±0.2 V. Then, if the input is ±0.2 V or above, there comes to a saturation. An output thereof is 6 bits. Then, the A/D converter 5 outputs a value of complement of "2". For instance, "−32" is "$100000_{BIN}$", and "31" is "$011111_{BIN}$".

A converted digital value is inputted to the gain correction circuit 6. The gain correction circuit 6 calculates an error between this inputted digital value and the target amplitude value. The target value is set to "15" that is a half of the dynamic range of the A/D converter 5. A 5-bit error signal is outputted. The gain correction circuit 6 will be explained later with reference to FIG. 5.

This error signal is inputted to the current type D/A converter 7. The current type D/A converter 7 converts the digital error signal into an analog current quantity. The maximum current value is set in the current type D/A converter 7 in accordance with the 3-bit maximum current set value. Then, in a range of the set maximum current value, a current corresponding to the 5-bit error signal is outputted. This 3-bit maximum current set value is given through an AND gate 14.

This analog current is inputted to a loop filter 8 constructed of a condenser (350 pF). The loop filter 8 converts the analog current into a control voltage. Then, the loop filter 8 supplies the gain control amplifier 3 with this control voltage.

A control circuit 9 is constructed of a microprocessor. A memory 10 is connected to the microprocessor 9. The memory 10 has, as shown in FIG. 6, a table stored with maximum current set values of the respective zones. As shown in FIG. 6, the set value is "001" in the zones "1"–"3". The set value is "010" in the zones "4"–"6" and is "011" in the zones "7"–"9". The set value is "100" in the zones "10" and "11".

The processor 9 outputs a clock SCLK, serial data SDATA and a write mode signal SMODE to the serial interface 12 via the serial interface circuit 11.

When receiving the seek command, with reference to the table of the memory 10, the processor 9 obtains the maximum current set value of the zone to which a target address belongs. Then, the processor 9 outputs the maximum current set value to the serial interface 12 via the serial interface circuit 11.

The maximum current set value given from the serial interface 12 is written to a current set register 13. The current set register 13 converts a 3-bit serial maximum current set value into a 3-bit parallel current set value.

Figure 25:
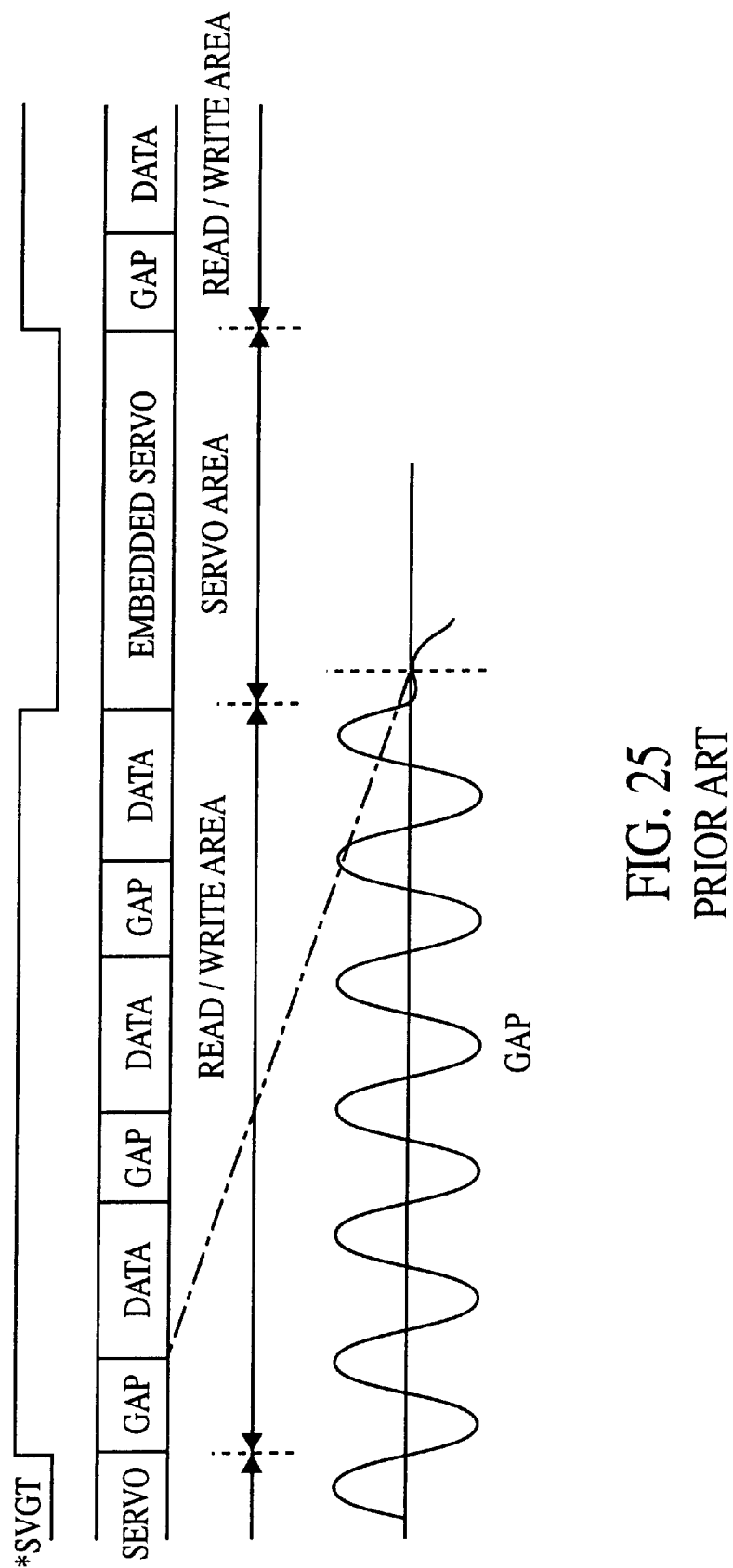
FIG. 25 is an explanatory diagram showing a track format in the prior art.

The AND gate 14 is constructed of 3-bit AND gates. The three AND gates take AND of the respective bits of the maximum current set value and a servo gate signal *SVGT given from the processor 9. The servo gate signal is, as shown in FIG. 25, a signal assuming a low level in the servo area of each track.

Accordingly, as shown in FIG. 7, the servo signal takes a high level in the read/write area, and the set values "001"–"100" of the current set register 13 are outputted to the output of the AND gate 14. Whereas in the servo area, the servo gate signal takes the low level, and therefore the output of the AND gate 14 indicates the set value "000".

On the other hand, in the current type D/A converter 7, as will be mentioned later on, when the maximum current set value is "001", the maximum current value is ±9 μA. Further, when the maximum current set value is "010", the maximum current value is ±11 μA. Moreover, when the maximum current set value is "011", the maximum current value is ±13 μA. Further, when the maximum current set value is "100", the maximum current value is ±15 μA. When the maximum current set value is "000", the maximum current value is ±10 μA.

Therefore, the current type D/A converter 7 is adjusted to the maximum current of a value corresponding to the transfer rate of each zone sought by the head in the read/write area. On the other hand, in the servo area, the current type D/A converter 7 is adjusted to the maximum current of a value adapted to the transfer rate of the servo area.

Referring back to FIG. 5, the gain correction circuit 6 will be explained.

A 6-bit output of the A/D converter 5 is inputted to an EOR circuit 61. The EOR circuit 61 takes EOR of the most significant bit of the 6-bit output and lower-order 5 bits, thereby obtaining an absolute value (5 bits) of the 6-bit digital output. A subtracter 62 subtracts a target value "15" from the output of the EOR circuit 61, thus calculating an error quantity.

A limiter circuit 63 limits the error quantity. The limiter circuit 63, when a phase shifts largely, limits the error quantity so that the gain does not excessively increase. A flip-flop 64 holds an error quantity one before. An adder 65 adds the one-before error quantity and a present-time error quantity of the flip-flop 64, thus obtaining an average value. The reason why this average value is taken will be explained. If the phase of the sampling clock of the A/D converter 5 shifts with respect to the analog input, the positive and negative error quantities are not equalized. Hence, the positive and negative error quantities are evened by taking the average value. A fluctuation in the control voltage is thereby prevented.

A comparator 67 compares the error quantity with the dynamic range ("31") of the A/D converter 5. The comparator 67 detects that the gain is extremely large as in the case of the start-up and a switchover from the head having a large output to the head having a small output. Then, the comparator 67 serves to indicate the error quantity at the plus maximum to decrease the gain soon.

A comparator 68 compares the error quantity with a zero determination level. The comparator 68 detects a low amplitude. A shift register 69 holds an output of the comparator 68 while shifting it. A shift register 69, when the low amplitude continues for a short period of time, judges it to be an invalid signal and indicates the error quantity to be zero. Further, the shift register 69, when the low amplitude continues long, judges that the gain is too small, and indicates the error quantity at the minus maximum to increase the gain quickly.

A multiplexer 66, when the error quantity is indicated at the plus maximum by the comparator 67, outputs the plus-maximum error quantity ("+15"). The multiplexer 66, when the error quantity is indicated to be zero by the shift register 69, outputs the zero error quantity.

The multiplexer 66, when the error quantity is indicated at the minus maximum by the shift register 69, outputs the minus-maximum error quantity ("−15"). The multiplexer 66 outputs an error quantity of the adder 65 in other cases.

Note that Japanese Patent Laid-Open Publication No.6-111478 be referred to for more detailed operations thereof.

Figure 8:
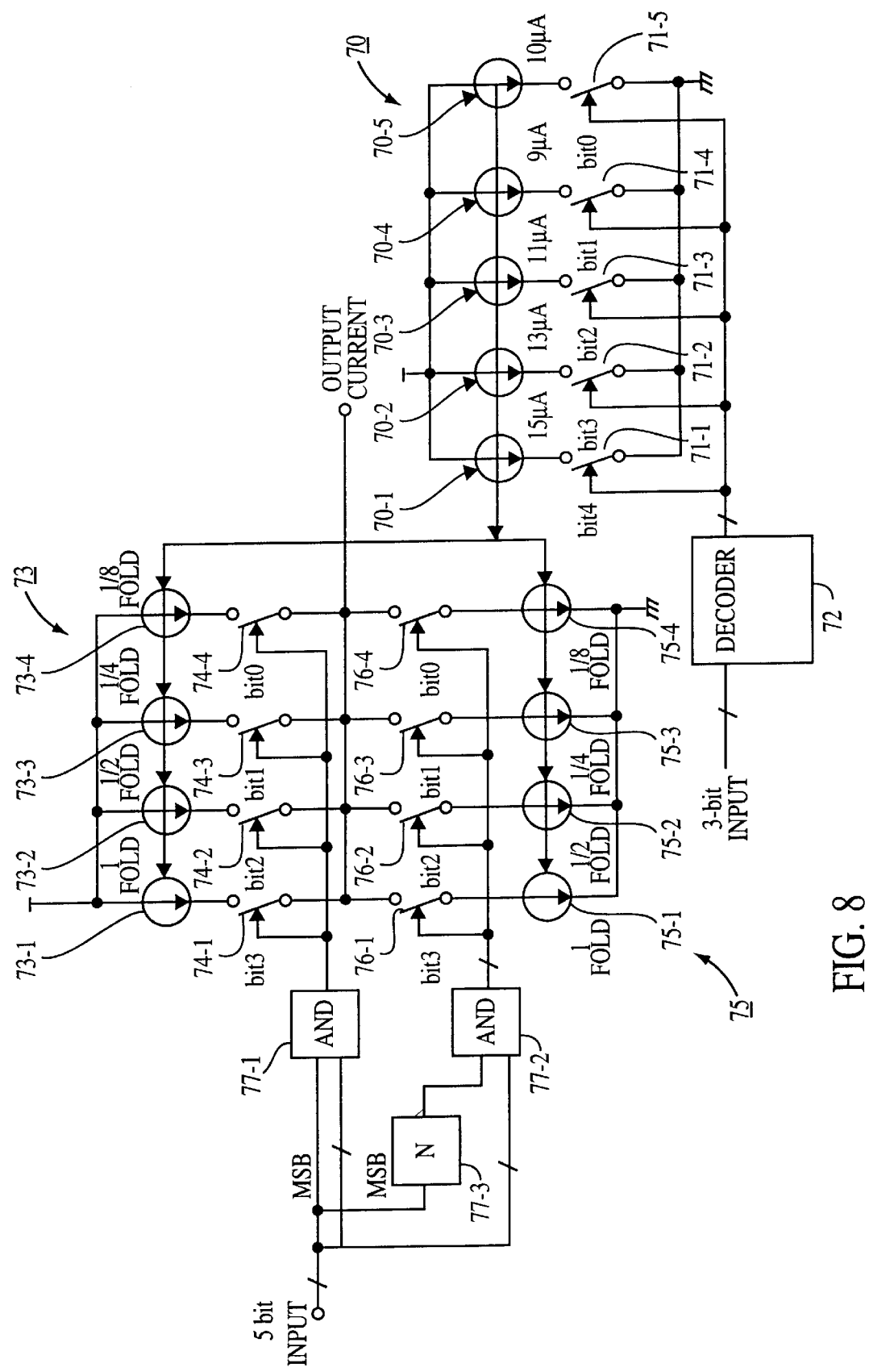
FIG. 8 is a diagram showing a construction of the current type digital-to-analog converter in FIG. 2.

FIG. 8 is a diagram showing a construction of the current type D/A converter shown in FIG. 2. FIG. 9 is an explanatory diagram showing the operation in the construction shown in FIG. 8. FIGS. 10 through 14 are diagrams illustrating waveform of the respective portions.

As shown in FIG. 8, a reference current source 70 includes a reference current source 70-1 of 15 μA, a reference current source 70-2 of 13 μA, a reference current source 70-3 of 11 μA, a reference current source 70-4 of 9 μA, and a reference current source 70-5 of 10 μA. Switches 71-1 to 71-5 are respectively connected to the reference current sources 70-1 to 70-5.

A decoder 72 decodes a 3-bit set value into a 5-bit selection signal as shown in FIG. 9. Respective selection signals bit4–bit0 drive the switches 71-1 to 71-5.

Accordingly, as illustrated in FIG. 9, if the 3-bit set value is, e.g., "000", the selection signals bit4–bit1 become "0", while only the selection signal bit0 is "1". Therefore, upon turning ON the switch 71-5, the reference current source 70-5 of 10 μA operates. The reference current source 70 thereby outputs the reference current of 10 μA.

A plus-side current source 73 includes a current source 73-1 for multiplying the reference current by a factor of 1, a current source 73-2 for multiplying the reference current by a factor of ½, a current source 73-3 for multiplying the reference current by a factor of ¼, and a current source 73-4 for multiplying the reference current by a factor of ⅛. Switches 74-1 to 74-4 are connected respectively to the current sources 73-1 to 73-4.

A minus-side current source 75 includes a current source 75-1 for multiplying the reference current by a factor of 1, a current source 75-2 for multiplying the reference current by a factor of ½, a current source 75-3 for multiplying the reference current by a factor of ¼, and a current source 75-4 for multiplying the reference current by a factor of ⅛. Switches 76-1 to 76-4 are connected respectively to the current sources 75-1 to 75-4.

An AND gate 77-1 is constructed of four AND gates. Each AND gate takes AND of the most significant bit of a 5-bit error signal and lower-order 4 bits thereof. Plus-side error signals bit3–bit0 are thereby obtained. These error signals bit3–bit0 drive the switches 74-1 to 74-4.

An inverting circuit 77-3 inverts the most significant bit of the error signal. An AND gate 77-2 is constructed of four AND gates. Each AND gate takes AND of an output of the inverting circuit 77-3 and the lower-order 4 bits of the error signal. Minus-side error signals bit3–bit0 are thereby obtained. These error signals bit3–bit0 drive the switches 76-1 to 76-4.

Output currents are obtained from connecting points between the switches 74-1 to 74-4 and the switches 76-1 to 76-4.

Thus, the reference current corresponding to the 3-bit set value is generated. Then, with this reference current serving as the maximum current, the output current corresponding to the error signal is obtained. For example, as illustrated in FIG. 7, if the 3-bit set value is "000", the reference current source 70 outputs the reference current of 10 μA. Then, an output range becomes ±10 μA.

In this way, the current type D/A converter 7 is set to the maximum current value corresponding to the set value.

Figure 10:
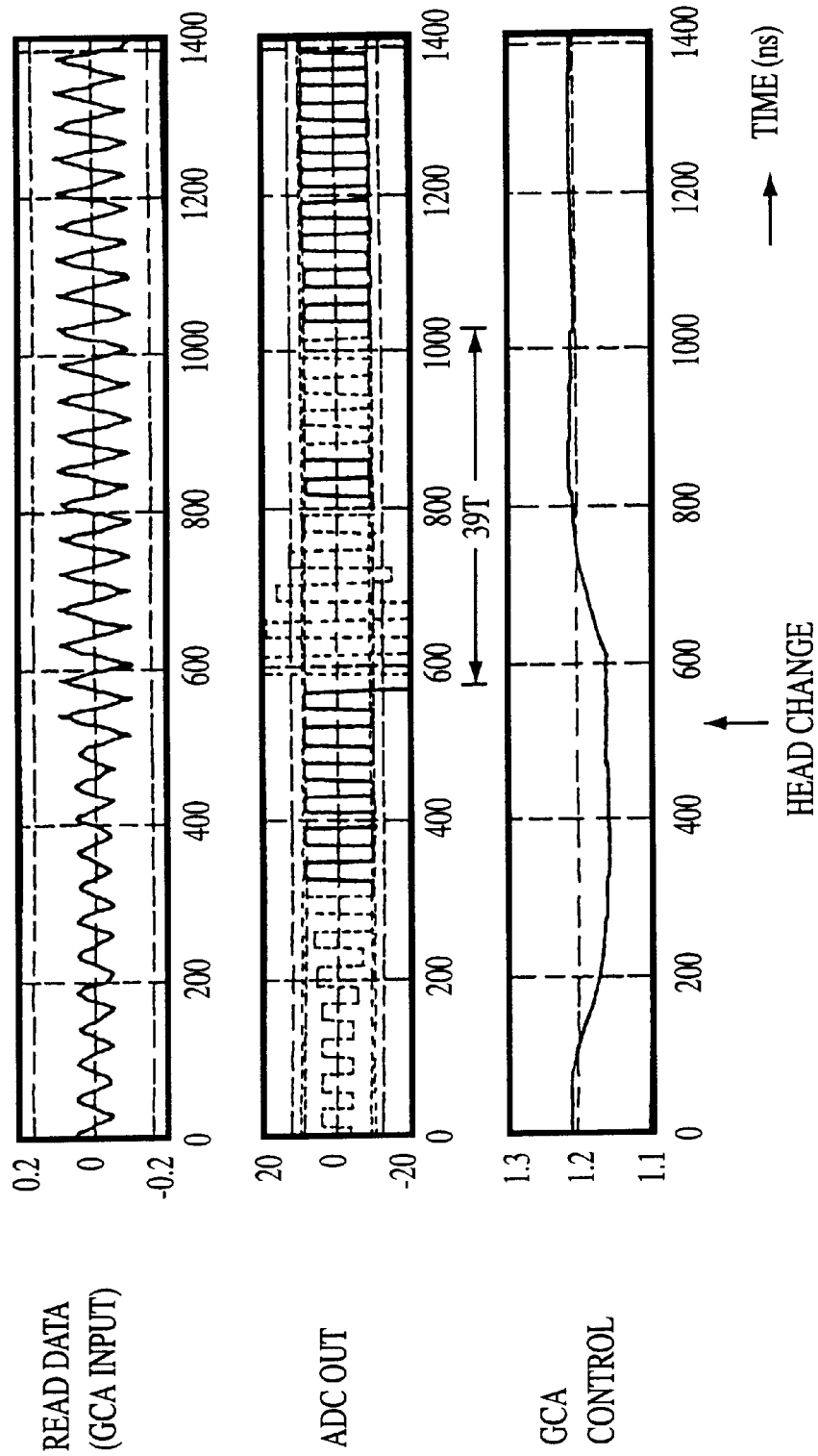
FIG. 10 is a diagram (part 1) illustrating waveforms of respective portions, for explaining the first embodiment of the present invention.
Figure 11:
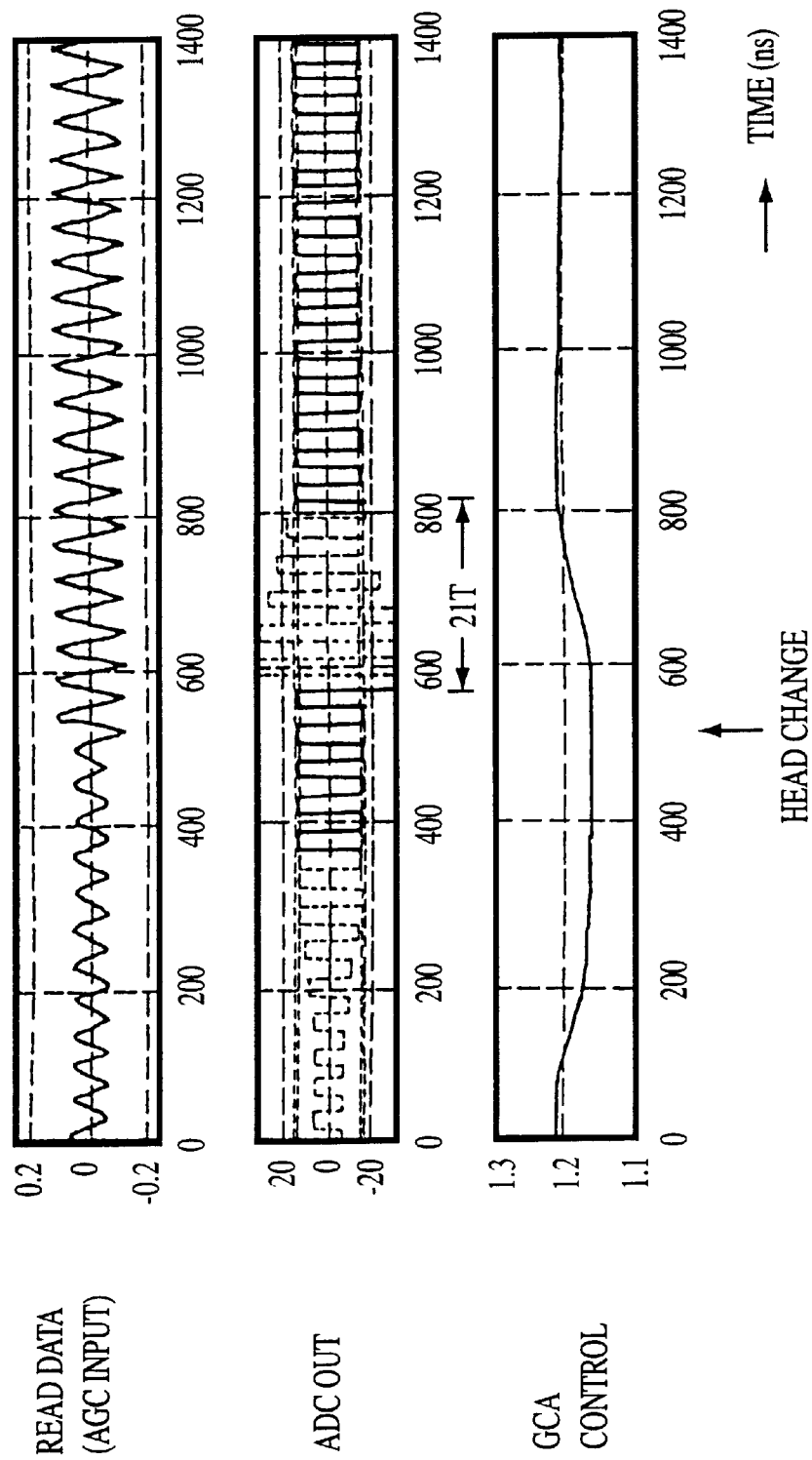
FIG. 11 is a diagram (part 2) illustrating the waveforms of the respective portions, for explaining the first embodiment of the present invention.
Figure 12:
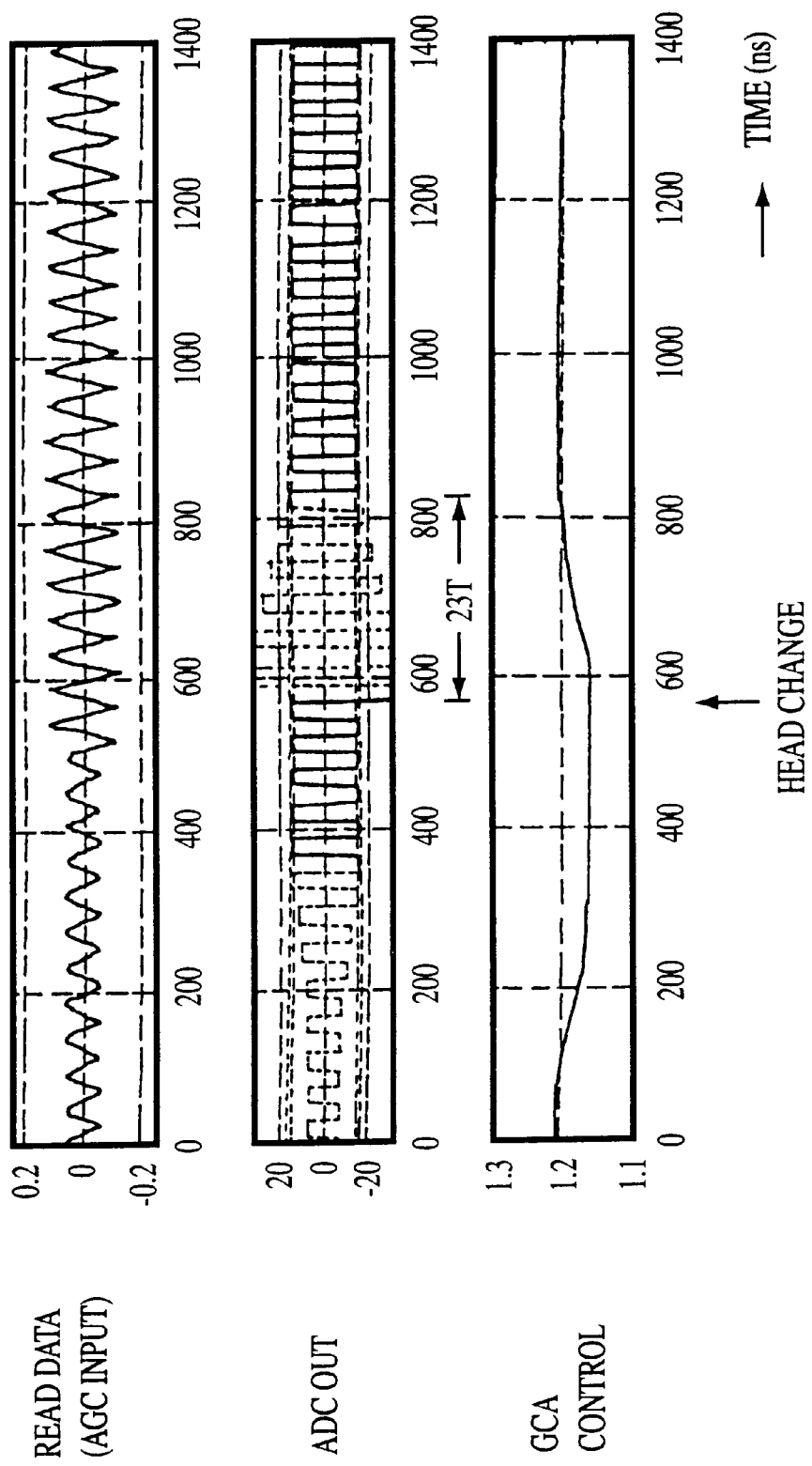
FIG. 12 is a diagram (part 3) illustrating the waveforms of the respective portions, for explaining the first embodiment of the present invention.

FIGS. 10 through 12 show waveforms in the innermost zone on the magnetic disk. More specifically, there are depicted the waveforms, obtained by simulation, showing variations in the read data (GCA input), the output (ADCout) of the A/D converter and the control voltage (GCA CONTROL), wherein the transfer rate is 10.0 MB (Mega Byte)/s, and the clock period T is 11. 1 ns. Herein, the axis of abscissa is the time (ns). Shown therein is a case where the output changes to a 2-fold head at a timing of 550 ns.

FIG. 10 shows a case where a maximum current value IDAC of the current type D/A converter 7 is ±10 μA. FIG. 11 shows a case where similarly the maximum current value IDAC is ±9 μA. FIG. 12 shows a case where the maximum current value IDAC is ±8 μA.

Referring to FIGS. 10 through 12, the output ADCout of the A/D converter is emphasized. In FIG. 10, 39T (39 clocks) is needed till a convergence on the target value is attained. In FIG. 11, 21T is required till the convergence on the target value is attained. In FIG. 12, 23T is needed till the convergence on the target value is attained.

It can be understood from the result thereof that the fastest convergence in the innermost zone occurs when the maximum current value IDAC in FIG. 11 is ±9 μA.

Figure 13:
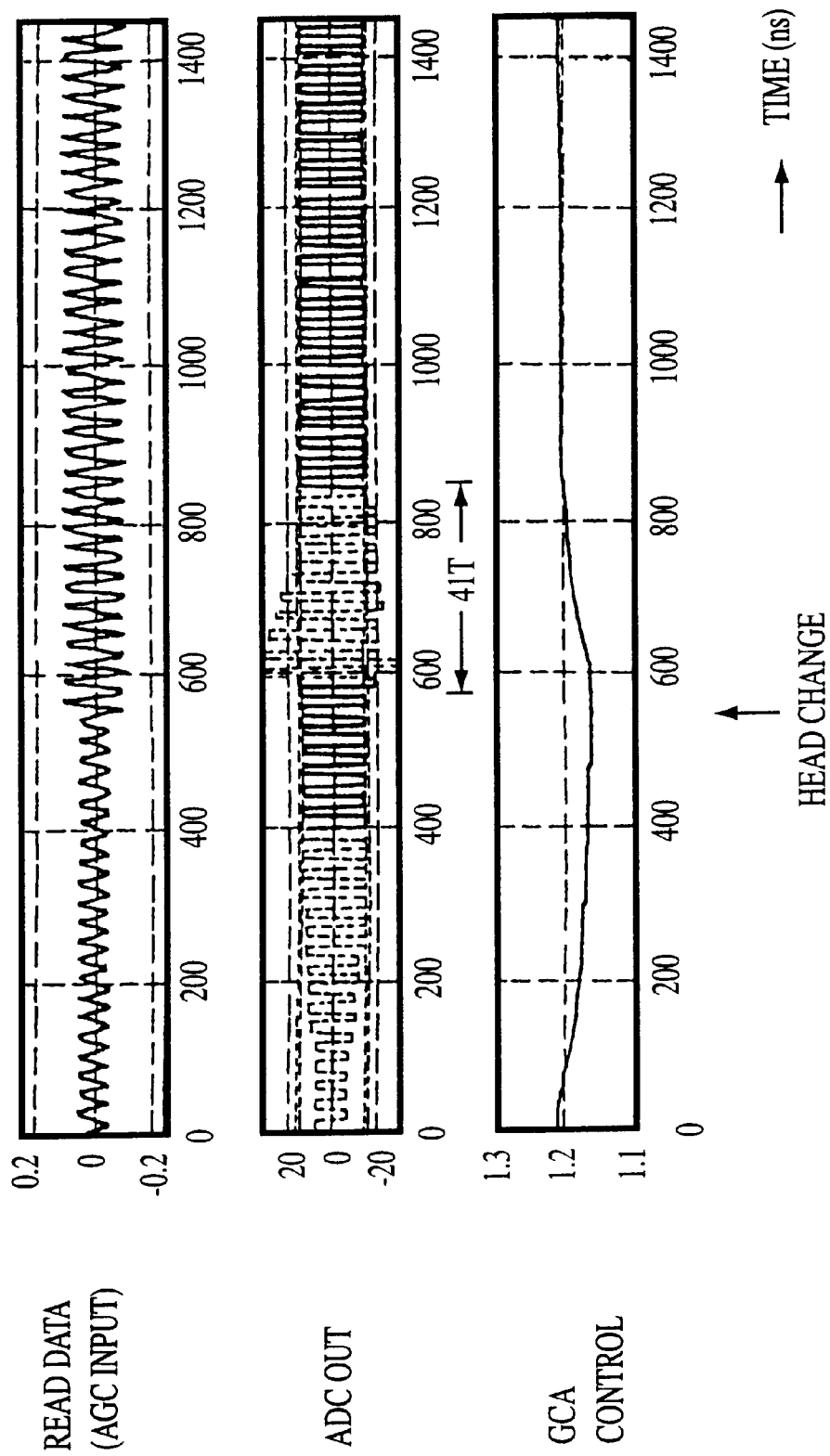
FIG. 13 is a diagram (part 4) illustrating the waveforms of the respective portions, for explaining the first embodiment.
Figure 14:
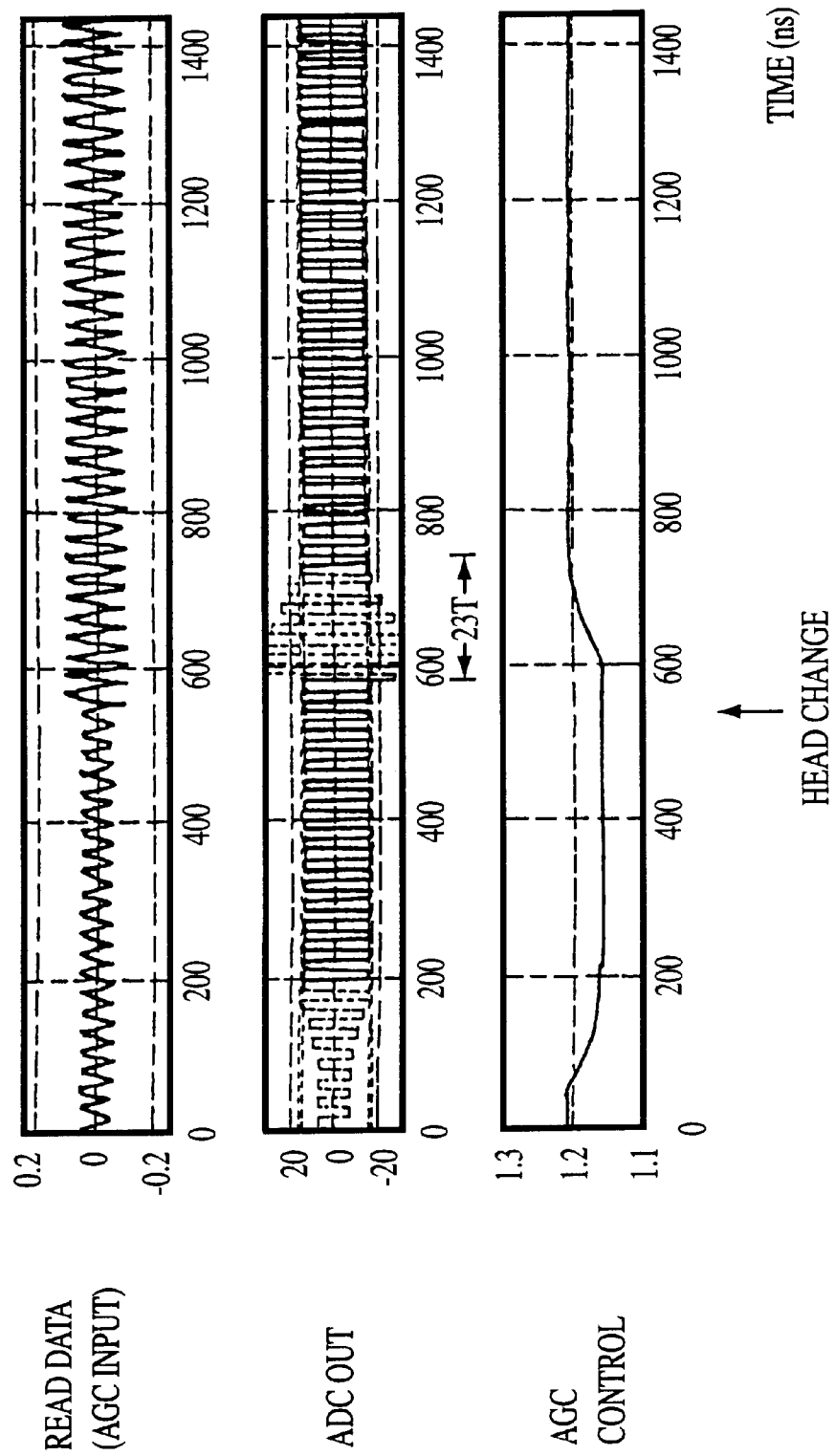
FIG. 14 is a diagram (part 5) illustrating the waveforms of the respective portions, for explaining the first embodiment.

Similarly, FIGS. 13 and 14 show waveforms in the outermost zone. To be more specific, there are depicted the waveforms, obtained by simulation, showing variations in the read data (GCA input), the output (ADCout) of the A/D converter and the control voltage (GCA CONTROL), wherein the transfer rate is 17.5 MB (Mega Byte)/s, and the clock period T is 6.35 ns. Herein, the axis of abscissa is the time (ns). Shown therein is a case where the output changes to the 2-fold head at the timing of 550 ns.

FIG. 13 shows a case where the maximum current value IDAC of the current type D/A converter 7 is ±9 μA. FIG. 14 shows a case where similarly the maximum current value IDAC is ±15 μA.

Referring to FIGS. 13 and 14, the output ADCout of the A/D converter is emphasized. In FIG. 13, 41T (41 clocks) is needed till the convergence on the target value is attained. In FIG. 14, 23T is required till the convergence on the target value is attained.

It can be understood from the result thereof that the fastest convergence in the outermost zone occurs when the maximum current value IDAC in FIG. 11 ±15 μA.

As described above, it can be recognized that the maximum current value with the AGC minimum converging speed differs. Accordingly, the AGC converging speed is minimized by changing the maximum current value of the current type D/A converter depending on the zones, and a GAP length can be reduced.

Figure 16:
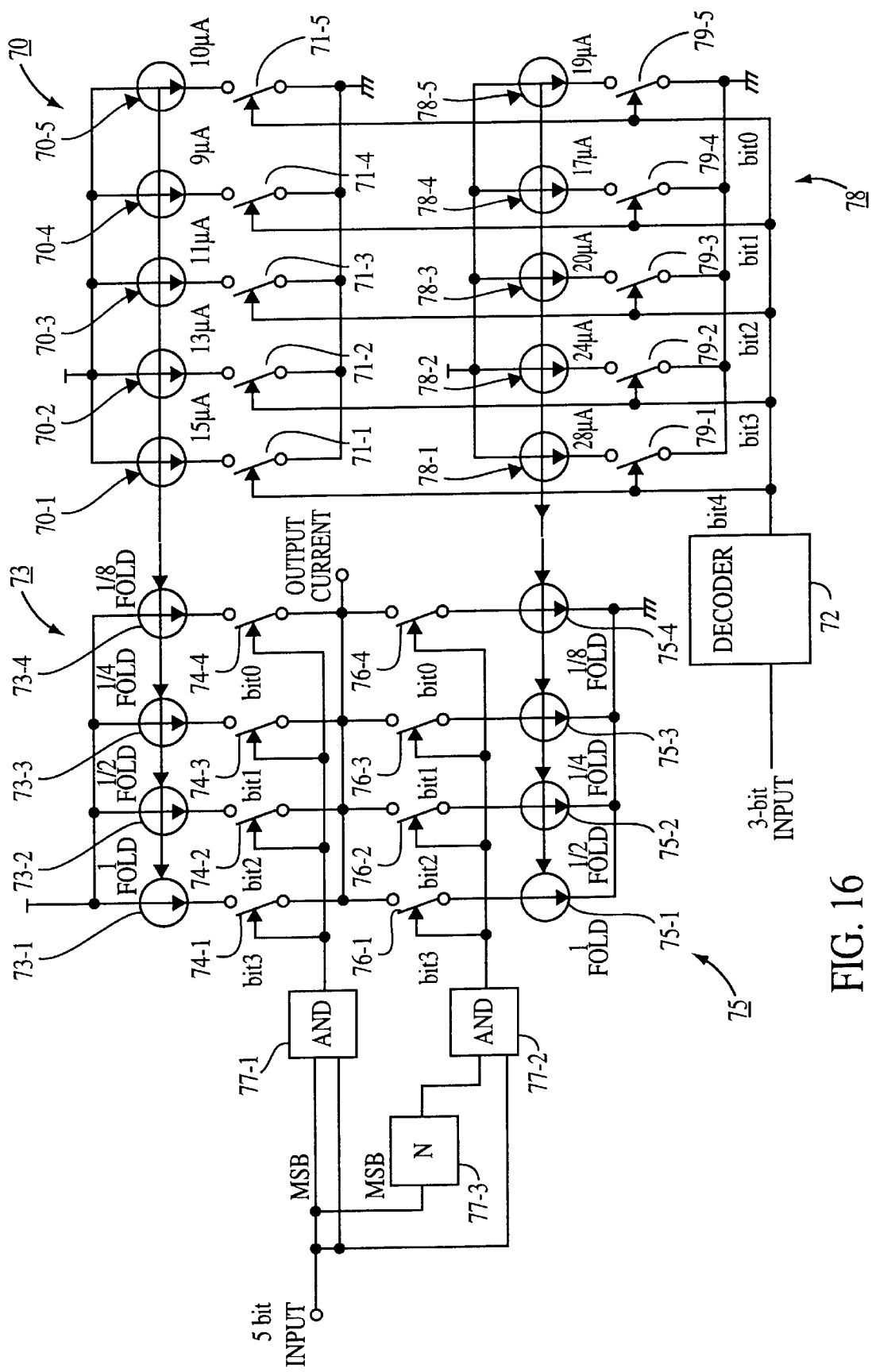
FIG. 16 is a diagram showing a construction of the current type digital-to-analog converter in the second embodiment of the present invention.

FIG. 15 is an explanatory diagram of the operation, showing a second embodiment of the present invention. FIG. 16 is a diagram illustrating a construction of the current type D/A converter in the second embodiment of the present invention.

As described above with reference to FIG. 27, an AGC operating speed when increasing the gain is slower than the AGC operating speed when decreasing the gain. For increasing the AGC operating speed when increasing the gain, the minus-side maximum current value of the current type D/A converter is set larger than the plus-side maximum current value.

That is, as explained in FIG. 3, the gain control amplifier 3 decreases the gain in proportion to the control voltage. Therefore, the minus-side maximum current value of the current type D/A converter is set larger than the plus-side maximum current value, thereby increasing the operating speed when enhancing the gain.

As illustrated in FIG. 15, for instance, in the zones "1"–"3", the maximum current is set to ±9 μA on the plus side and to −17 μA on the minus side.

FIG. 16 illustrates a construction of the current type D/A converter for actualizing the above-mentioned. Referring to FIG. 16, the same components as those shown in FIG. 8 are marked with the identical numerals.

A second reference current source 78 generates a minus-side reference current. The second reference current source 78 includes a reference current source 78-1 of 28 μA, a reference current source 78-2 of 24 μA, a reference current source 78-3 of 20 μA, a reference current source 78-4 of 17 μA, and a reference current source 78-5 of 19 μA. Switches 79-1 to 79-5 are connected to the respective reference current sources 78-1 to 78-5.

Selection signals bit4–bit0 of a decoder 72 drive the switches 78-1 to 78-5.

In this embodiment, the first reference current source 70 is employed as a plus-side reference current source. The first reference current source 70 supplies the plus-side current source 73 with the reference current. On the other hand, a second reference current source 78 is used as a minus-side reference current source and supplies the minus-side current source 75 with the reference current.

Therefore, as shown in FIG. 15, for example, the 3-bit set value is "000", the selection signals bit4–bit1 become "0", and only the selection bit 0 becomes "1". Consequently, the switches 71-5, 79-5 are turned ON, and the reference current source 70-7 of 10 μA and the reference current source 78-5 of 19 μA are operated. With this operation, the first reference current source 70 supplies the plus-side current source 73 with the reference current of 10 μA, and the second reference current source 78 supplies the minus-side current source 75 with the reference current of 19 μA.

The maximum current value of the current type D/A converter 7 thereby becomes 10 μA on the plus side and 19 μA on the minus side.

As shown in FIG. 15, in this embodiment also, the maximum current value is varied depending on the zones. Accordingly, the operating speed in the case of enhancing the gain increases, and, in addition, there is exhibited such an effect that the GAP length of the respective tracks when performing the zone bit recording, can be reduced.

Figure 17:
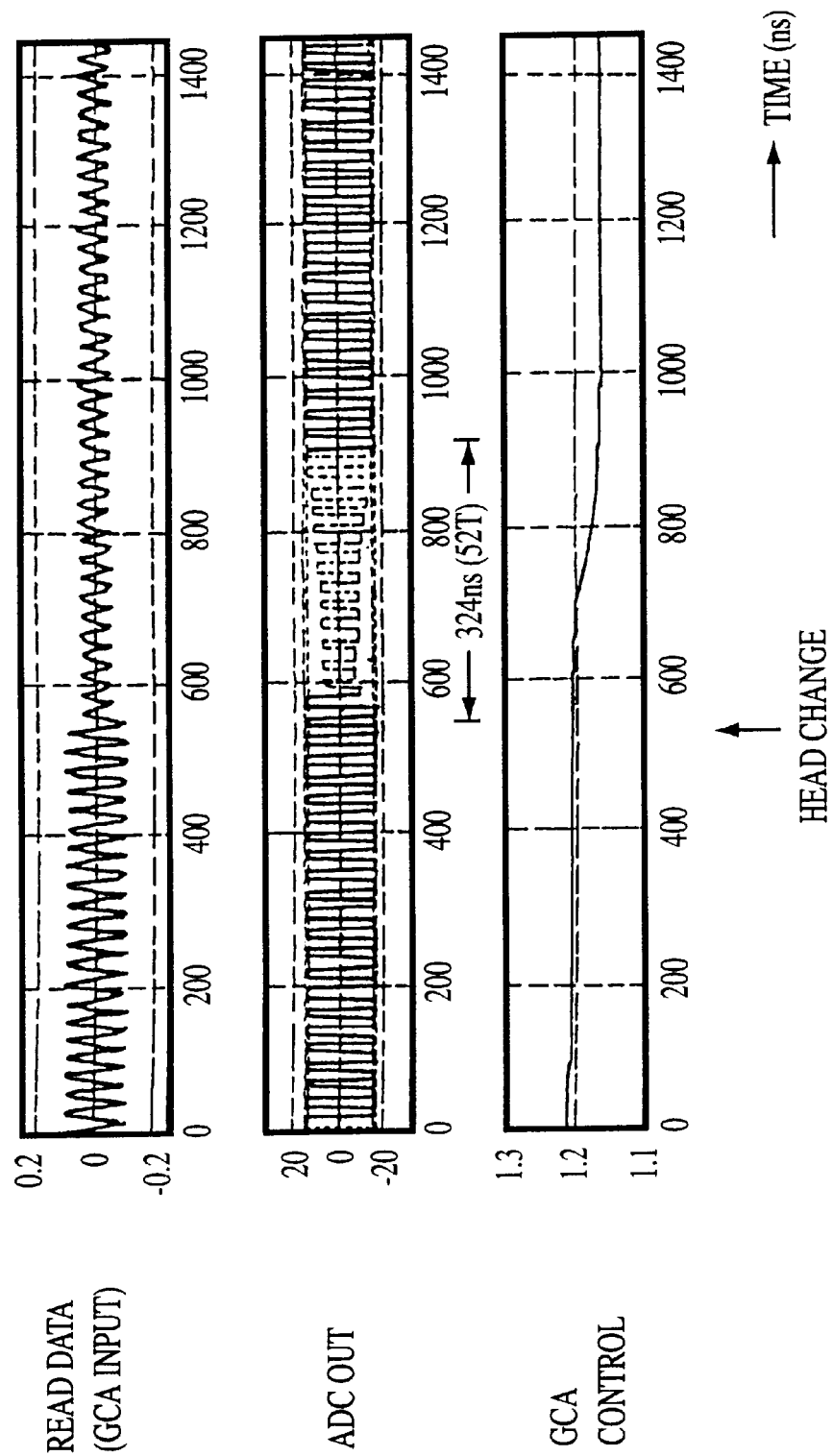
FIG. 17 is a diagram (part 1) of the waveforms of the respective portions, for explaining the second embodiment of the present invention.
Figure 18:
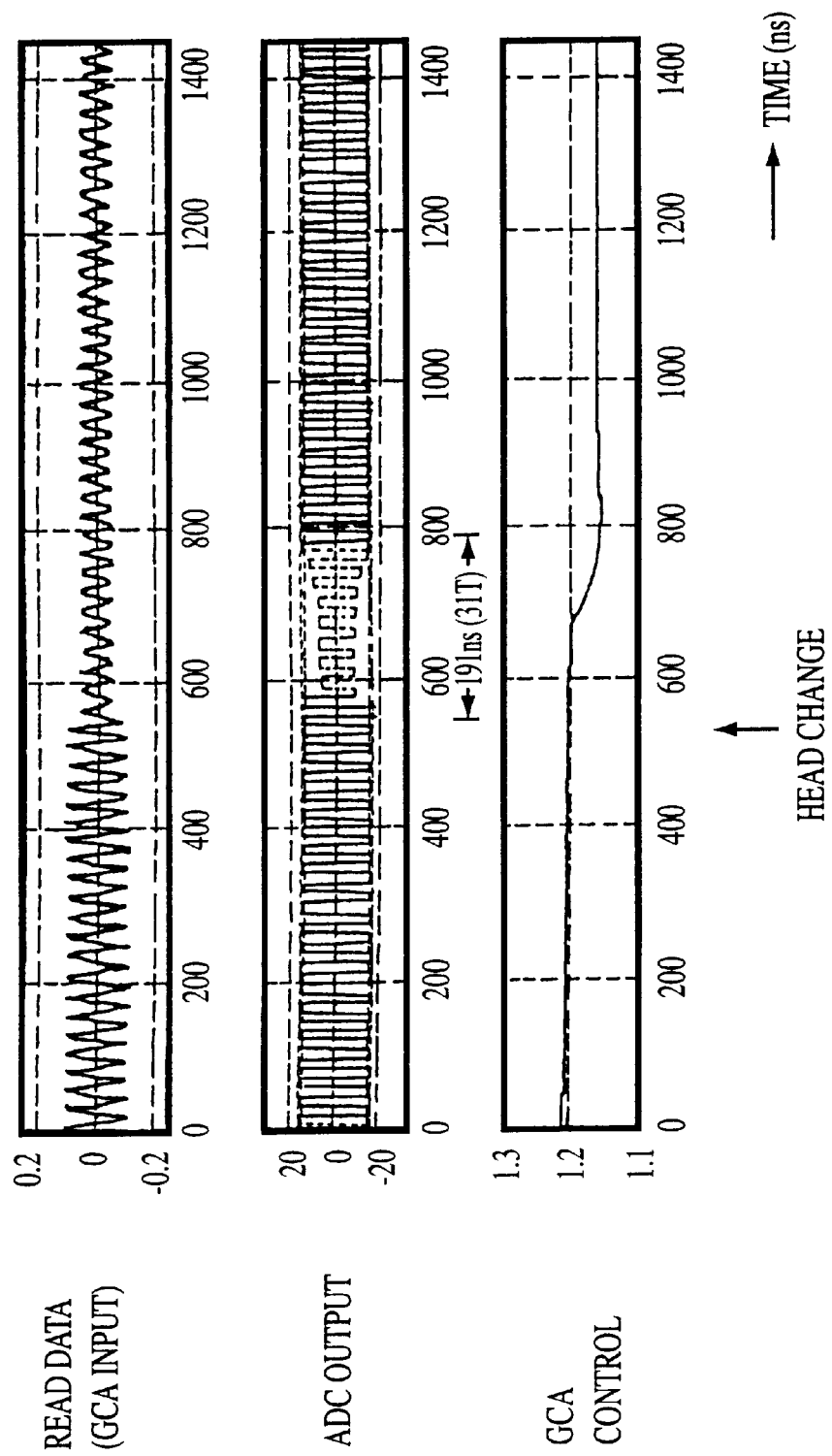
FIG. 18 is a diagram (part 2) of the respective portions, for explaining the second embodiment of the present invention.

FIGS. 17 and 18 show waveforms in the outermost zone. More specifically, there are depicted the waveforms, obtained by simulation, showing variations in the read data (GCA input), the output (ADCout) of the A/D converter and the control voltage (GCA CONTROL), wherein the transfer rate is 17.5 MB (Mega Byte)/s, and the clock period T is 6.35 ns. Herein, the axis of abscissa is the time (ns). Shown therein is a case where the output changes to a ½-fold head at a timing of 550 ns. That is, there is shown a case where the gain is increased by a factor of 2.

FIG. 17 shows a case where the maximum current value of the current type D/A converter 7 is ±15 μA. FIG. 18 similarly shows a case where the maximum current value IDAC is +15 μA (plus side) and −28 μA (minus side).

Referring to FIGS. 17 and 18, the output ADCout of the A/D converter is emphasized. In FIG. 17, 52T (52 clocks) is needed till the convergence on the target value is attained. In FIG. 18, 31T is required till the convergence on the target value is attained. It can be understood from the result thereof that the fastest convergence occurs when the maximum current value IDAC in FIG. 18 is +15 μA (plus side) and −28 μA (minus side).

That is, the operating speed when enhancing the gain is increased by setting the minus-side maximum current value larger than the plus-side maximum current value.

Figure 19:
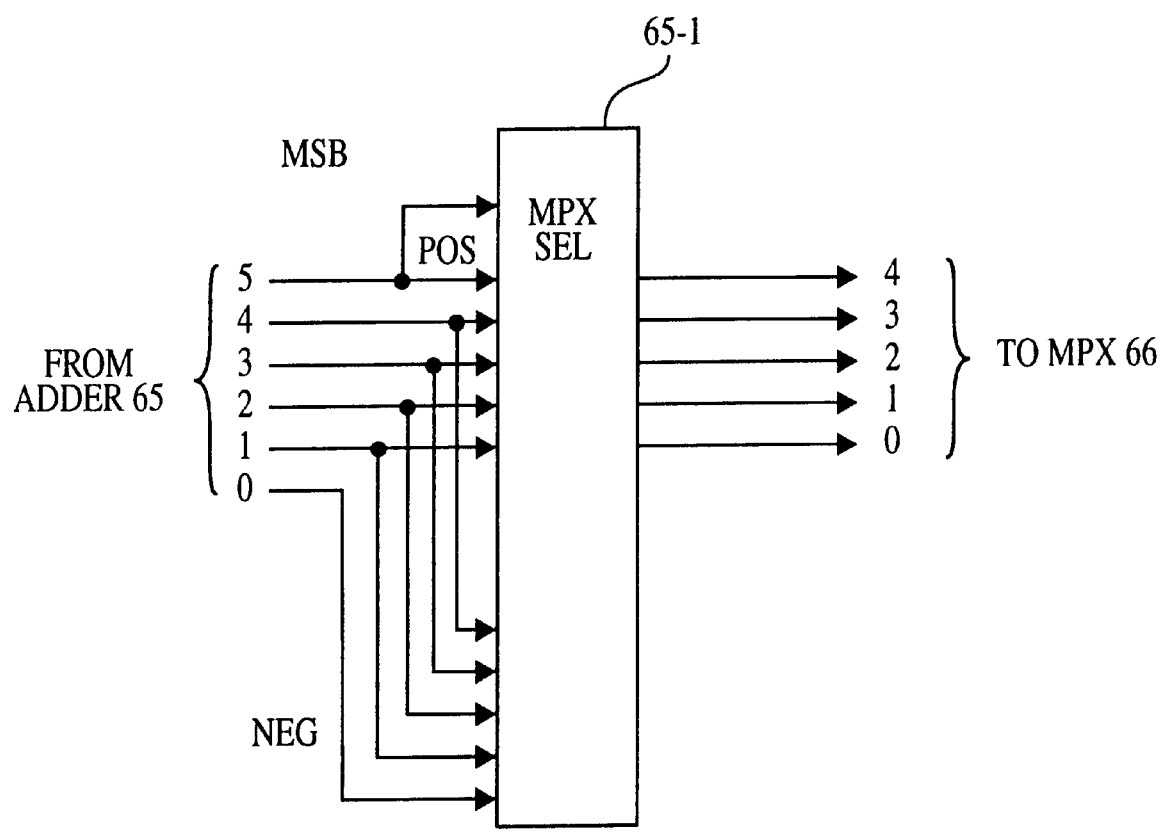
FIG. 19 is an explanatory diagram showing a third embodiment of the present invention.

FIG. 19 is an explanatory diagram showing a third embodiment of the present invention.

Figure 27:
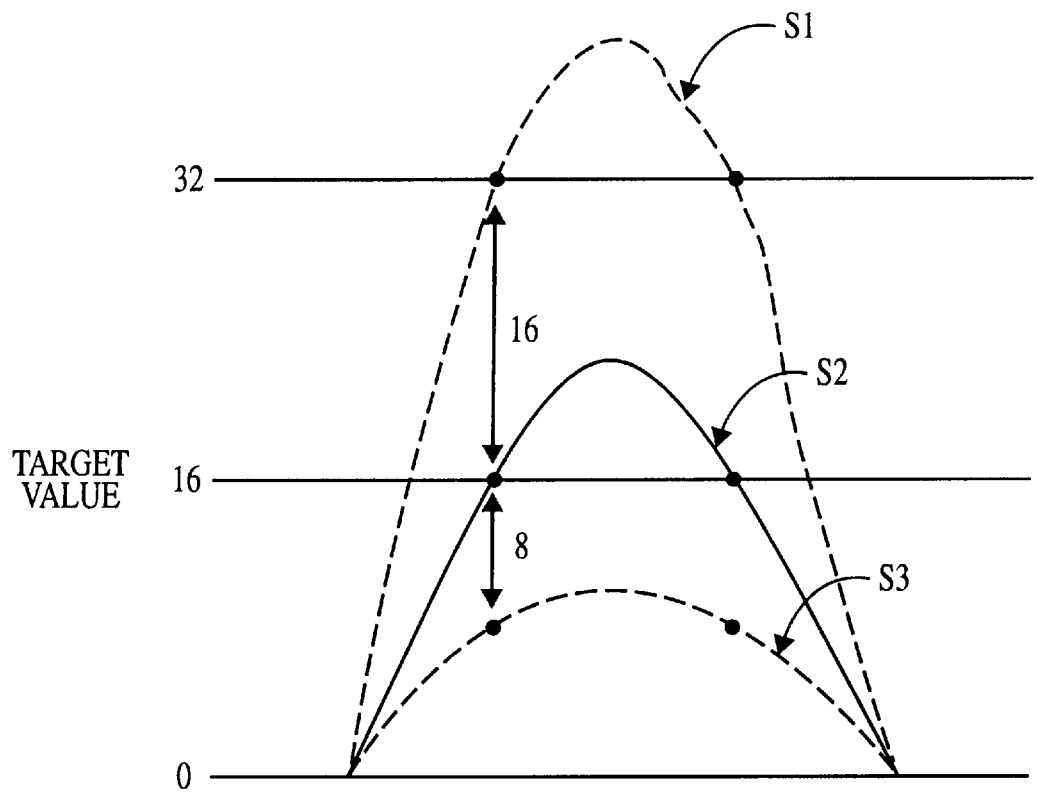
FIG. 27 is an explanatory diagram showing an AGC operation in the prior art.

As explained with reference to FIG. 27, the AGC operating speed when increasing the gain is slower than the AGC operating speed when decreasing the gain. For increasing the AGC operating speed when increasing the gain, a bit weight of the error signal is changed corresponding to positive and negative polarities of the error signal. That is, the plus-side bit weight is made lighter than a minus-side bit weight.

Therefore, in the gain correction circuit 6 explained in FIG. 6, a multiplexer 65-1 as shown in FIG. 19 is provided in between the adder 65 and the multiplexer 66.

This multiplexer 65-1 receives an 6-bit error output from the adder 65, and selects the error signal by the most significant bit MSB. The multiplexer 65-1, when determining it as a plus-side error signal by the most significant bit MSB, selects the higher-order 5 bits as an error signal from the 6-bit error signal.

Reversely, the multiplexer 65-1, when determining it as a minus-side error signal by the most significant bit MSB, selects the lower-order 5 bits as an error signal from the 6-bit error signal.

The minus-side bit weight thereby becomes twice as heavy as the plus-side bit weight. With the operation thus performed, the operating speed when enhancing the gain (in the case of the error signal being minus) can be increased.

Figure 20:
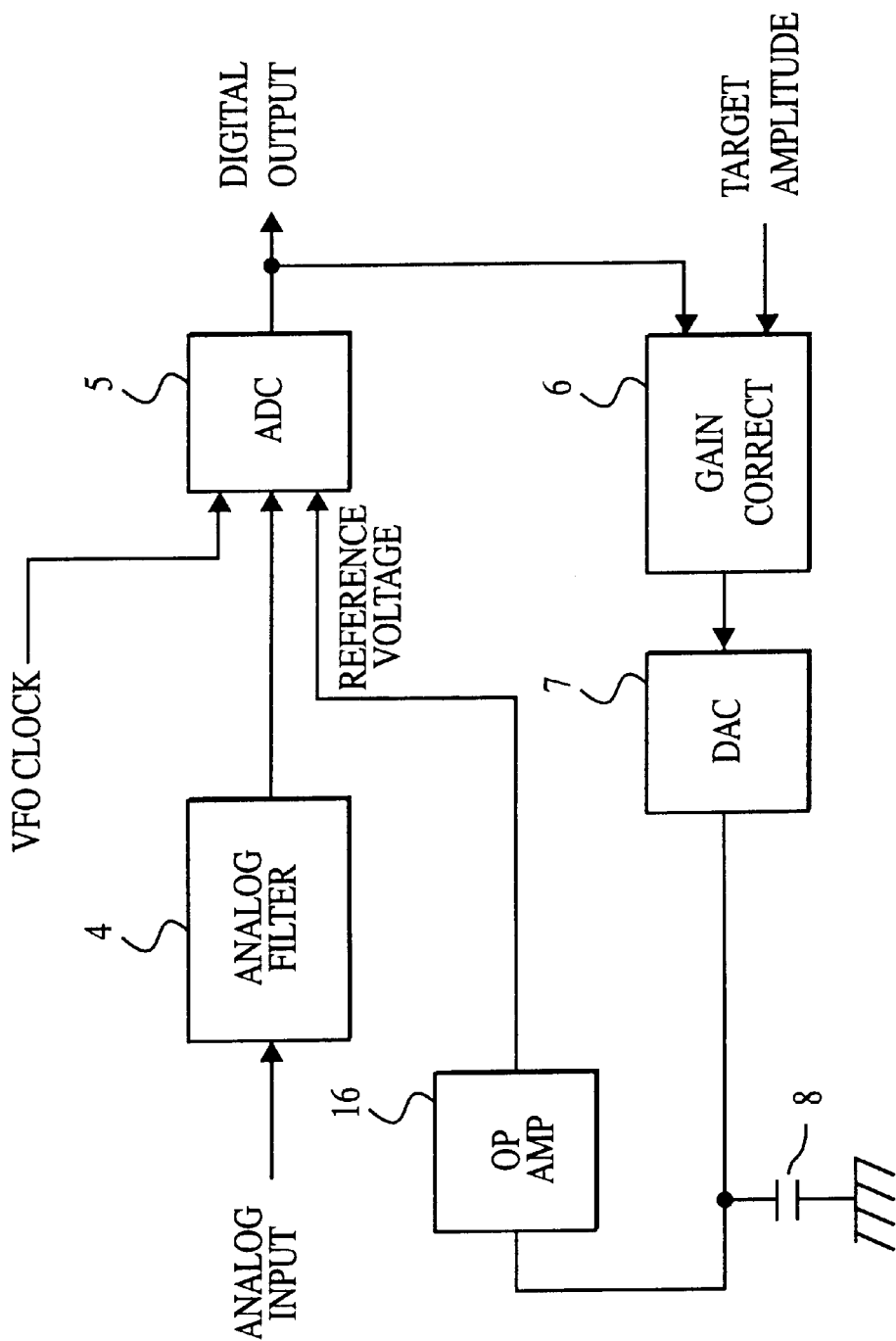
FIG. 20 is a diagram illustrating a construction in a fourth embodiment of the present invention.
Figure 21:
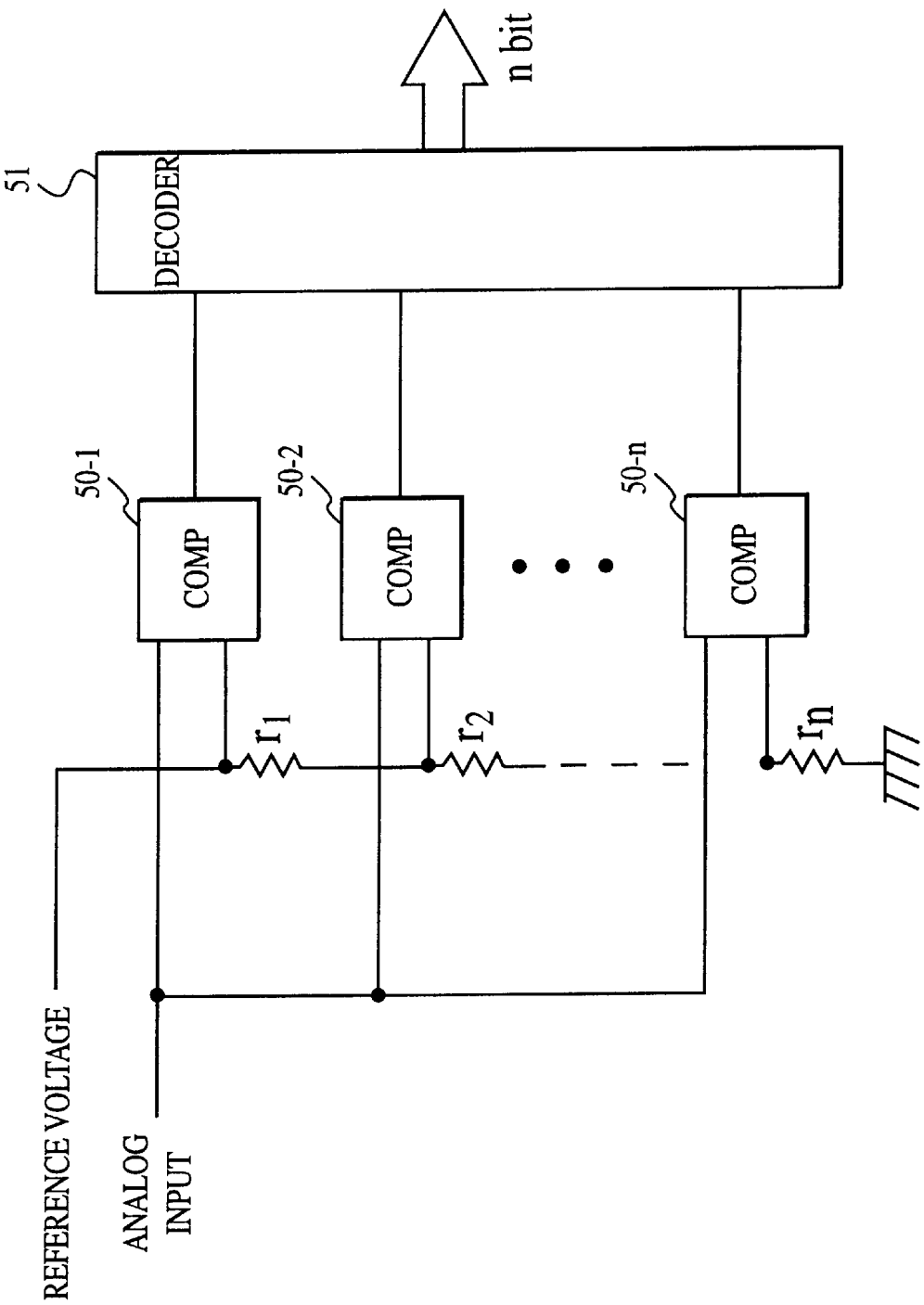
FIG. 21 is a diagram illustrating a construction of analog-to-digital converter in FIG. 20.

FIG. 20 is a diagram illustrating a construction in a fourth embodiment of the present invention. FIG. 21 is a diagram showing a configuration of the A/D converter in FIG. 20.

Referring to FIG. 20, the same components as those shown in FIG. 2 are marked with the identical numerals. An operational amplifier 16 amplifies the control voltage of the loop filter 8. An amplified output thereof controls the A/D converter 5 as a reference voltage of the A/D converter 5.

In the fourth embodiment, the gain control amplifier 3 is omitted. Then, the A/D converter 5 is used as a gain control amplifier. The reason for this is elucidated as follows. The analog circuit is weak of noises and therefore desirably omitted as much as possible. Further, the analog circuit in terms of a circuit design of CMOS-LSI is more difficult than the digital circuit. Hence, the analog circuit of the gain control amplifier, etc. is omitted.

A construction of the A/D converter 5 for actualizing the above-mentioned is described. As illustrated in FIG. 21, the A/D converter 5 includes n-pieces of comparators 50-1 to 50-n, and a decoder 51. Then, for the reference voltage, n-pieces of resistors r1–rn are connected in series. The analog signals are inputted to one input terminals of the respective comparators 50-1 to 50-n. The reference voltage through the resistors r1–rn is inputted to the other input terminals of the comparators 50-1 to 50-n.

The reference voltage through these resistors r1–rn involves the use of a voltage proportional to the control voltage described above. The A/D converter 5 can be thereby used as a gain control amplifier. As a result, the gain control amplifier can be omitted, and the analog circuits of the AGC circuit can be reduced in number.

Figure 22:
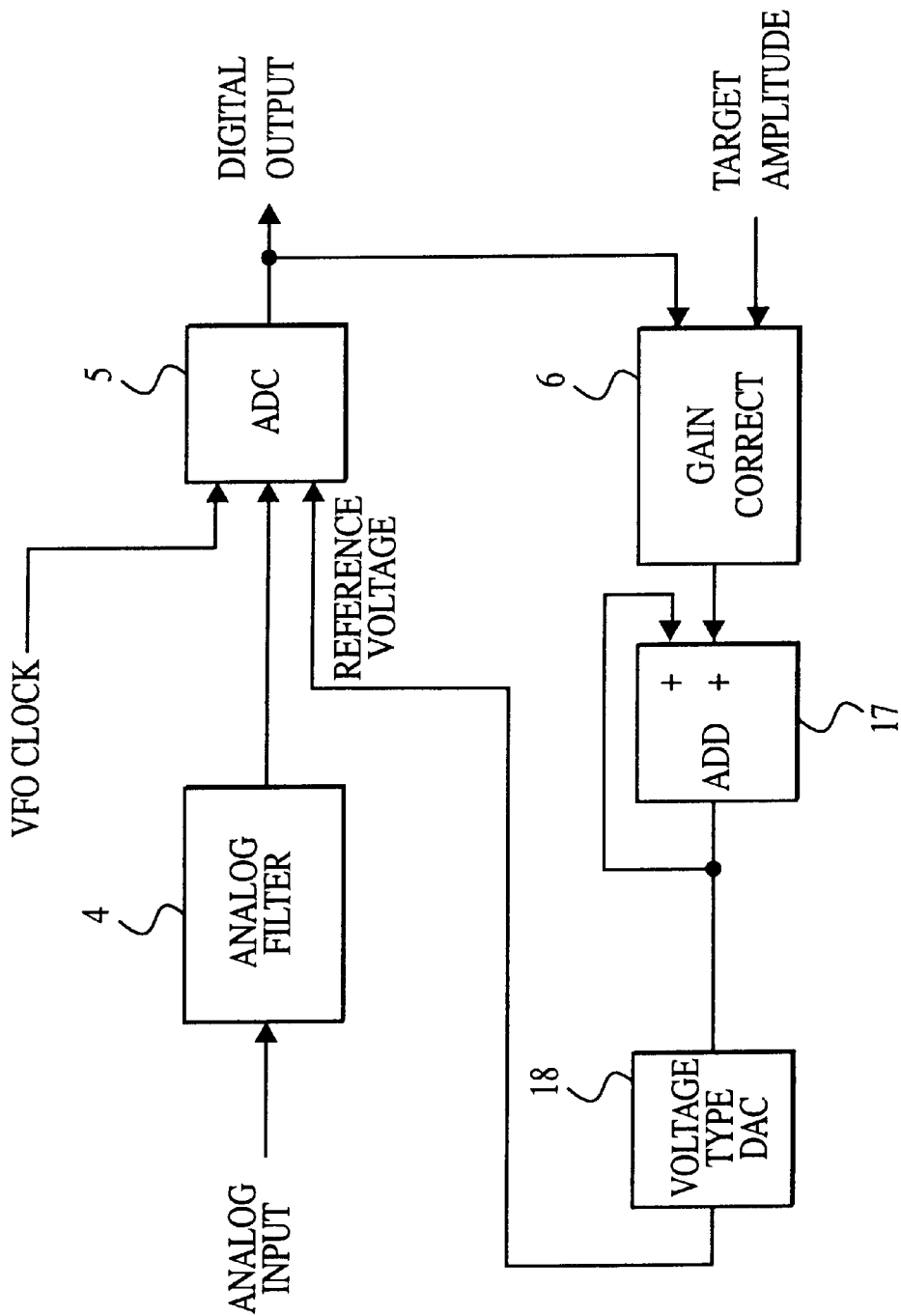
FIG. 22 is a diagram showing a construction in a fifth embodiment of the present invention.
Figure 23:
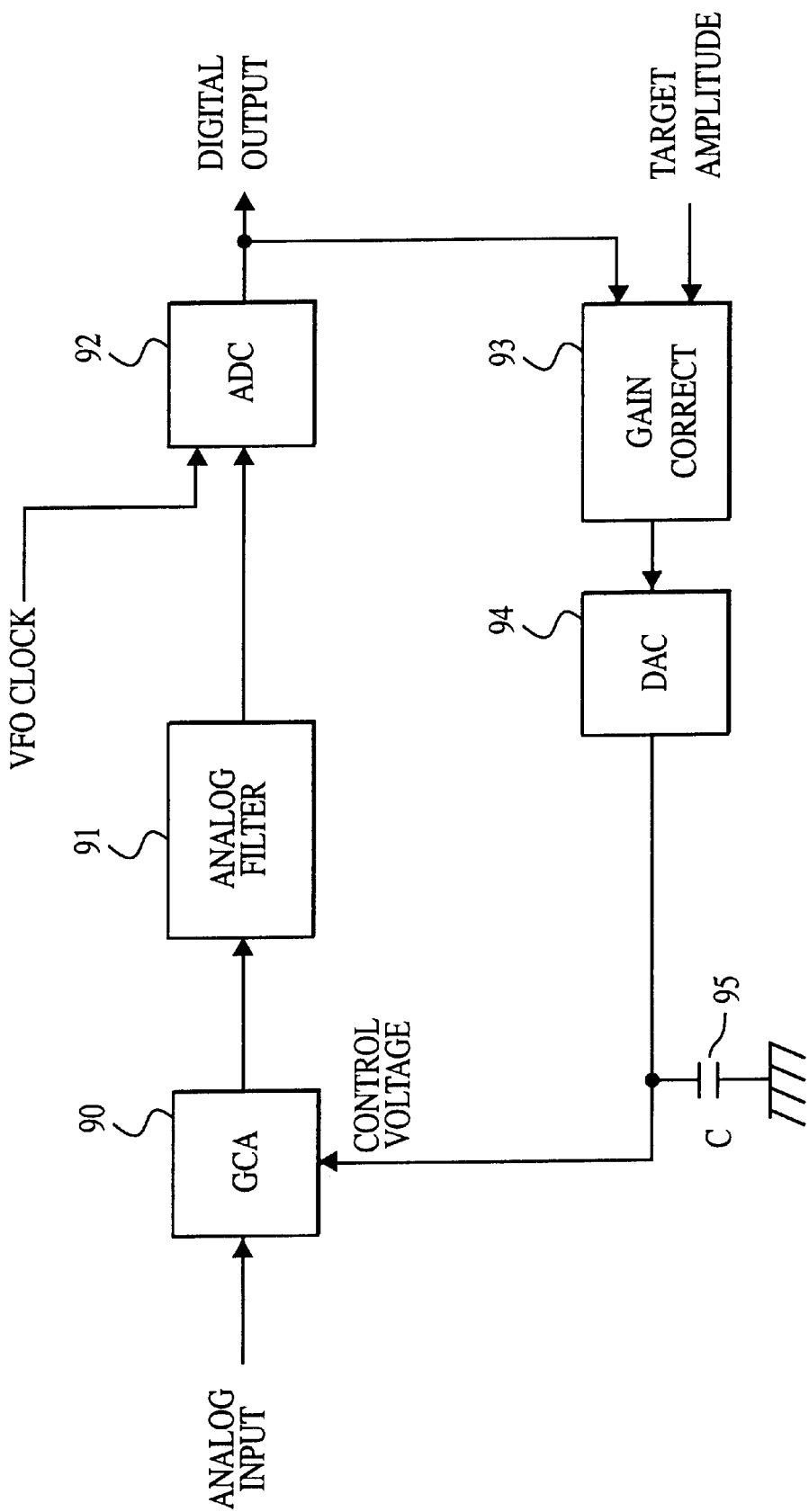
FIG. 23 is a diagram showing a construction of the prior art.
Figure 24:
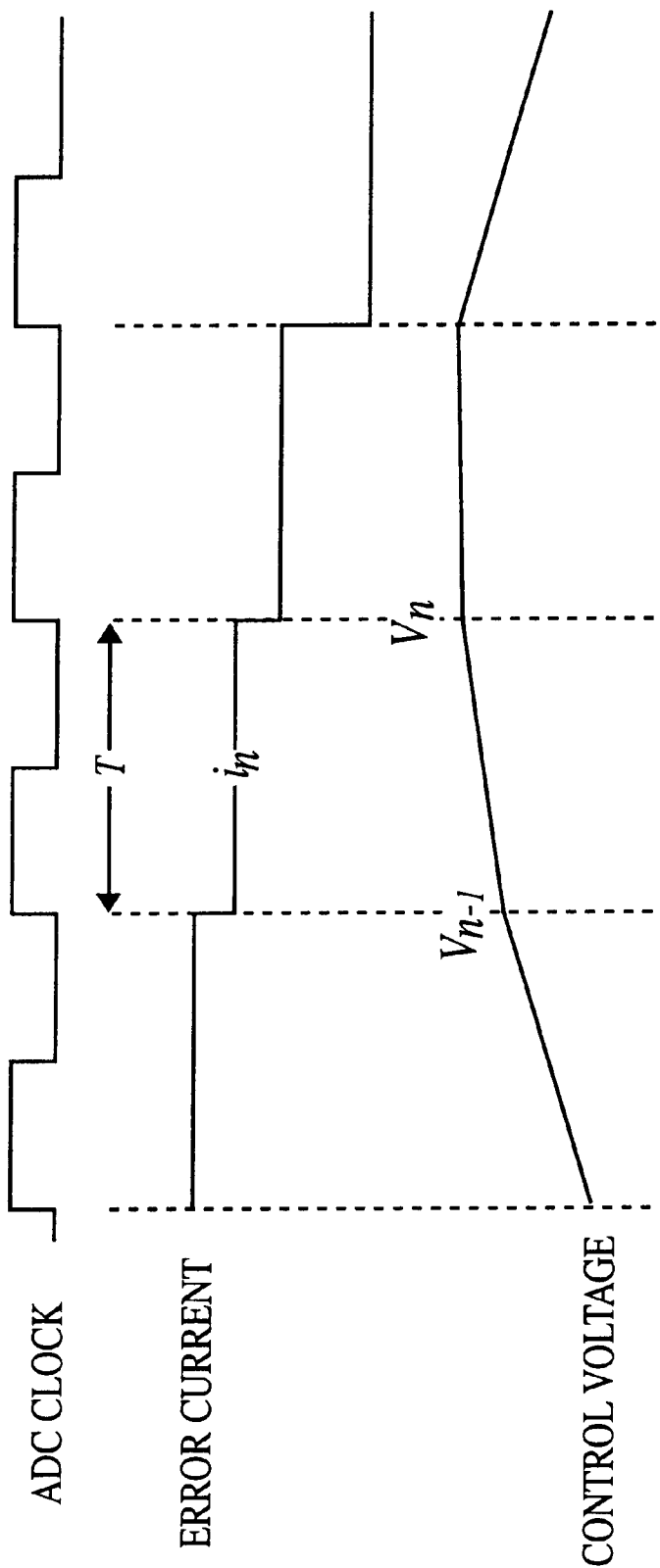
FIG. 24 is an explanatory diagram showing the prior art.

FIG. 22 is a diagram illustrating a fifth embodiment of the present invention.

Referring to FIG. 22, the same components as those shown in FIGS. 2 through 21 are marked with the identical numerals. An adder 17 adds an error signal one sample before and an error signal of present time, of the gain correction circuit 6. The adder 17 averages the error signals. A voltage type D/A converter 18 converts the error signal into a control voltage. This control voltage controls the A/D converter 5 as a reference voltage of the A/D converter 5.

In the fifth embodiment, a function of the loop filter is actualized by the adder. Therefore, the analog loop filter can be omitted. Further, as in the embodiment shown in FIG. 20, the A/D converter 5 is used as a gain control amplifier. Hence, the gain control amplifier can be omitted.

In addition to the embodiments discussed above, the present invention may be modified as below.

First, there has been exemplified the case where the maximum current in the read/write area is changed corresponding to the respective zones when varying the maximum current in the read/write area and the servo area. The present invention can be, however, applied to a case where the maximum current in the read/write area is not changed for every zone.

Second, there has been exemplified the case where the maximum current is changed also for every zone when varying the plus- and minus-side maximum currents of the current type D/A converter. The present invention is, however, applicable also to a case where the maximum current is not changed.

Third, there has been exemplified the case where the zone bit recording is carried out when varying the plus- and minus-side maximum currents of the current type D/A converter. The present invention is, however, applicable to a case where the zone bit recording is not performed.

Fourth, the disk storage medium has been explained in the form of the magnetic disk. The present invention is, however, applicable to other disk storage mediums.

The present invention has discussed so far by way of the embodiments. A variety of modifications can be carried out within the scope of the gist of the present invention, and those modifications are not excluded from the range of the present invention.

As discussed above, the present invention exhibits the following effects.

First, the maximum current value of the current type D/A converter 7 is changed for every zone in the zone bit recording. Therefore, even the sampling period changes in each zone, the gain adjusting time of the AGC circuit can be minimized in each zone. The GAP length in the respective zones can be thereby reduced, and consequently the storage capacity can be increased.

Second, the maximum current value of the current type D/A converter 7 is changed in the read/write area and in the data surface servo area on the disk storage medium 1, is varied in the zone bit recording. Hence, even when the sampling period is varied in each area, the gain adjusting time of the AGC circuit can be minimized in each of the servo area and the read/write area. The GAP length in the read/write area can be reduced, and the servo area can be decreased, thereby enlarging the storage capacity.

Third, the current type D/A converter is constructed so that the plus-side maximum current value is different from the minus-side maximum current value. Further, the error calculator includes the circuit for converting the digital signal so that the plus-side bit weight of the digital signal indicating the error, is different from the minus-side bit weight of the digital signal indicating the error. Therefore, the operation is speeded up when increasing the gain also, and the gain adjusting time of the AGC circuit ca be minimized. Accordingly, the GAP length in the read/write area can be reduced. The storage capacity can be thereby enlarged.

What is claimed is:

1. An AGC circuit, for controlling a level of a reading output of a head, used for a disk storage apparatus including a disk storage medium formed with zones in a circumferential direction, to which data are written at different transfer rates, and said head for reading the data from said disk storage medium, said AGC circuit comprising:
 a gain control amplifier for amplifying the reading output with a gain corresponding to a control voltage;
 a filter for filtering a signal transmitted from said gain control amplifier;
 an analog-to-digital converter for performing an analog-to-digital conversion of the signal from said filter;
 an error calculator for calculating an error between a target amplitude value and a digital output value of said analog-to-digital converter;
 a current type digital-to-analog converter for generating an electric current having a magnitude corresponding to the error;
 a loop filter for converting the electric current into the control voltage; and
 a control circuit for changing a maximum current value of said current type digital-to-analog converter in accordance with the zone sought by said head.

2. The AGC circuit of the disk storage apparatus according to claim 1, wherein said current type digital-to-analog converter is constructed to change the maximum current value in accordance with a set value, and said control circuit includes:
 a memory for storing the set value indicating the maximum current value corresponding to each zone on said disk storage medium; and
 a controller for setting the set value in said current type digital-to-analog converter in accordance with the zone sought by said head with reference to said memory.

3. The AGC circuit of the disk storage apparatus according to claim 1, wherein said current type digital-to-analog converter includes:

a reference current source for generating a reference current of a value corresponding to the set value given from said control circuit; and
 an output current source for generating an output current having a magnitude corresponding to the error on the basis of the reference current.

4. The AGC circuit of the disk storage apparatus according to claim 3, wherein said output current source includes:

a first output current source for generating an output current having a magnitude corresponding to the error when the error is of a plus polarity; and
 a second output current source for generating an output current having a magnitude corresponding to the error when the error is of a minus polarity.

5. The AGC circuit of the disk storage apparatus according to claim 1, wherein the control circuit changes the maximum current value of said current type digital-to-analog converter in a read/write area and in a data surface servo area on said disk storage medium.

6. The AGC circuit of the disk storage apparatus according to claim 1, wherein said current type digital-to-analog converter is constructed so that the plus-side maximum current value is different from the minus-side maximum current value.

7. The AGC circuit of the disk storage apparatus according to claim 6, wherein said current type digital-to-analog converter is constructed so that the minus-side maximum current value is set larger than the plus-side maximum current value.

8. The AGC circuit of the disk storage apparatus according to claim 6, wherein said current type digital-to-analog converter includes:

a first reference current source for generating a plus-side first reference current of a value corresponding to the set value from said control circuit;

a second reference current source for generating a minus-side second reference current of a value corresponding to the set value from said control circuit;

a first output current source for generating an output current having a magnitude corresponding to the error on the basis of the first reference current when the error is of the plus polarity; and a second output current source for generating an output current having a magnitude corresponding to the error on the basis of the second reference current when the error is of the plus polarity.

9. The AGC circuit of the disk storage apparatus according to claim 1, wherein said error calculator includes a circuit for converting the digital signal indicating the error so that a plus-side bit weight of the digital signal indicating the error is different from a minus-side bit weight of the digital signal indicating the error.

10. An AGC circuit, for controlling a level of a reading output of a head, used for a disk storage apparatus including a disk storage medium formed with zones in a circumferential direction, to which data are written at different transfer rates, and said head for reading the data from said disk storage medium, said AGC circuit comprising:

a gain control amplifier for amplifying the reading output with a gain corresponding to a control voltage;

a filter for filtering a signal transmitted from said gain control amplifier;

an analog-to-digital converter for performing an analog-to-digital conversion of the signal from said filter;

an error calculator for calculating an error between a target amplitude value and a digital output value of said analog-to-digital converter;

a current type digital-to-analog converter for generating an electric current having a magnitude corresponding to the error;

a loop filter for converting the electric current into the control voltage; and a control circuit for changing a maximum current value of said current type digital-to-analog converter in a read/write area and in a data surface servo area on said disk storage medium.

11. The AGC circuit of the disk storage apparatus according to claim 10, wherein said current type digital-to-analog converter includes:

a reference current source for generating a reference current of a value corresponding to a set value given from said control circuit; and an output current source for generating an output current having a magnitude corresponding to the error on the basis of the reference current.

12. An AGC circuit of a disk storage apparatus for controlling a level of a reading output of a head for reading from a disk storage medium, said AGC circuit comprising:

a gain control amplifier for amplifying the reading output with a gain corresponding to a control voltage;

a filter for filtering a signal transmitted from said gain control amplifier;

an analog-to-digital converter for performing an analog-to-digital conversion of the signal from said filter;

an error calculator for calculating an error between a target amplitude value and a digital output value of said analog-to-digital converter;

a current type digital-to-analog converter for generating an electric current having a magnitude corresponding to the error; and a loop filter for converting the current into the control voltage, wherein said current type digital-to-analog converter is constructed so that a plus-side maximum current value is different from a minus-side maximum current value.

13. The AGC circuit of the disk storage apparatus according to claim 12, wherein said current type digital-to-analog converter includes:

a first reference current source for generating a plus-side first reference current;

a second reference current source for generating a minus-side second reference current;

a first output current source for generating an output current having a magnitude corresponding to the error on the basis of the first reference current when the error is of the plus polarity; and a second output current source for generating an output current having a magnitude corresponding to the error on the basis of the second reference current when the error is of the minus polarity.

14. The AGC circuit of the disk storage apparatus according to claim 12, wherein said current type digital-to-analog converter is constructed so that the minus-side maximum current value is set larger than the plus-side maximum current value.

15. An AGC circuit of a disk storage apparatus for controlling a level of a reading output of a head for reading from a disk storage medium, said AGC circuit comprising:

a gain control amplifier for amplifying the reading output with a gain corresponding to a control voltage;

a filter for filtering a signal transmitted from said gain control amplifier;

an analog-to-digital converter for performing an analog-to-digital conversion of the signal from said filter;

an error calculator for calculating an error between a target amplitude value and a digital output value of said analog-to-digital converter;

a current type digital-to-analog converter for generating an electric current having a magnitude corresponding to the error; and a loop filter for converting the current into the control voltage, wherein said error calculator includes a circuit for converting the digital signal indicating the error so that a plus-side bit weight of the digital signal indicating the error is different from a minus-side bit weight of the digital signal indicating the error.

* * * * *